(12) United States Patent
Maruyama et al.

(10) Patent No.: US 10,038,012 B2
(45) Date of Patent: *Jul. 31, 2018

(54) SEMICONDUCTOR DEVICE AND MANUFACTURING METHOD THEREOF, DELAMINATION METHOD, AND TRANSFERRING METHOD

(71) Applicant: Semiconductor Energy Laboratory Co., Ltd., Atsugi-shi, Kanagawa-ken (JP)

(72) Inventors: Junya Maruyama, Ebina (JP); Toru Takayama, Atsugi (JP); Yumiko Ohno, Atsugi (JP); Shunpei Yamazaki, Setagaya (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/397,045

(22) Filed: Jan. 3, 2017

(65) Prior Publication Data

US 2017/0243895 A1 Aug. 24, 2017

Related U.S. Application Data

(60) Continuation of application No. 14/961,043, filed on Dec. 7, 2015, now Pat. No. 9,543,337, which is a (Continued)

(30) Foreign Application Priority Data

Dec. 27, 2002 (JP) .................................. 2002-379578

(51) Int. Cl.
*H01L 27/12* (2006.01)
*H01L 33/56* (2010.01)
(Continued)

(52) U.S. Cl.
CPC .... *H01L 27/1218* (2013.01); *H01L 21/76251* (2013.01); *H01L 27/1214* (2013.01);
(Continued)

(58) Field of Classification Search
None
See application file for complete search history.

(56) References Cited

U.S. PATENT DOCUMENTS 5,686,360 A 11/1997 Harvey et al.
5,757,126 A 5/1998 Harvey et al.
(Continued)

FOREIGN PATENT DOCUMENTS

CN 001256794 A 6/2000
CN 001312590 A 9/2001
(Continued)

OTHER PUBLICATIONS

"Realization of a Display That Is Thin, Light and Unbreakable", Nikkei Microdevices, Jul. 1, 2002, No. 205, pp. 71-72.
(Continued)

*Primary Examiner* — Alexander Ghyka
(74) *Attorney, Agent, or Firm* — Robinson Intellectual Property Law Office; Eric J. Robinson

(57) ABSTRACT

A substrate and a delamination film are separated by a physical means, or a mechanical means in a state where a metal film formed over a substrate, and a delamination layer comprising an oxide film including the metal and a film comprising silicon, which is formed over the metal film, are provided. Specifically, a TFT obtained by forming an oxide layer including the metal over a metal film; crystallizing the oxide layer by heat treatment; and performing delamination in a layer of the oxide layer or at both of the interface of the oxide layer is formed.

12 Claims, 32 Drawing Sheets

Related U.S. Application Data continuation of application No. 14/223,419, filed on Mar. 24, 2014, now Pat. No. 9,269,817, which is a division of application No. 13/587,111, filed on Aug. 16, 2012, now Pat. No. 8,691,604, which is a continuation of application No. 12/766,318, filed on Apr. 23, 2010, now Pat. No. 8,247,246, which is a continuation of application No. 10/740,501, filed on Dec. 22, 2003, now Pat. No. 7,723,209.

(51) Int. Cl.
| | |
|---|---|
| H01L 33/62 | (2010.01) |
| H01L 29/786 | (2006.01) |
| H01L 33/24 | (2010.01) |
| H01L 33/44 | (2010.01) |
| H01L 21/762 | (2006.01) |

(52) U.S. Cl.
CPC ...... *H01L 27/1248* (2013.01); *H01L 27/1266* (2013.01); *H01L 29/78603* (2013.01); *H01L 33/24* (2013.01); *H01L 33/44* (2013.01); *H01L 33/56* (2013.01); *H01L 33/62* (2013.01); *H01L 2221/68368* (2013.01)

(56) References Cited

U.S. PATENT DOCUMENTS

| | | | |
|---|---|---|---|
| 5,815,223 A | 9/1998 | Watanabe et al. | |
| 5,821,138 A | 10/1998 | Yamazaki et al. | |
| 5,834,327 A | 11/1998 | Yamazaki et al. | |
| 5,990,542 A | 11/1999 | Yamazaki | |
| 6,127,199 A | 10/2000 | Inoue et al. | |
| 6,153,495 A | 11/2000 | Kub et al. | |
| 6,162,741 A | 12/2000 | Akasaka et al. | |
| 6,168,966 B1 | 1/2001 | Fan et al. | |
| 6,271,101 B1 | 8/2001 | Fukunaga | |
| 6,290,804 B1 | 9/2001 | Henley et al. | |
| 6,309,950 B1 | 10/2001 | Forbes | |
| 6,319,757 B1 | 11/2001 | Parsons et al. | |
| 6,333,215 B1 | 12/2001 | Matsuda et al. | |
| 6,359,320 B1 | 3/2002 | Yamazaki et al. | |
| 6,372,608 B1 | 4/2002 | Shimoda et al. | |
| 6,387,771 B1 | 5/2002 | Genz et al. | |
| 6,410,436 B2 | 6/2002 | Yamagata et al. | |
| 6,423,614 B1 | 7/2002 | Doyle | |
| 6,441,468 B1 | 8/2002 | Yamazaki | |
| 6,445,059 B1 | 9/2002 | Yamazaki | |
| 6,521,511 B1 | 2/2003 | Inoue et al. | |
| 6,527,964 B1 | 3/2003 | Smith et al. | |
| 6,534,382 B1 | 3/2003 | Sakaguchi et al. | |
| 6,559,905 B1 | 5/2003 | Akiyama | |
| 6,569,595 B1 | 5/2003 | Sato et al. | |
| 6,593,213 B2 | 7/2003 | Stanbery | |
| 6,602,761 B2 | 8/2003 | Fukunaga | |
| 6,605,826 B2 | 8/2003 | Yamazaki et al. | |
| 6,624,046 B1 | 9/2003 | Zavracky et al. | |
| 6,627,518 B1 | 9/2003 | Inoue et al. | |
| 6,632,708 B2 | 10/2003 | Sakama et al. | |
| 6,645,830 B2 | 11/2003 | Shimoda et al. | |
| 6,653,209 B1 | 11/2003 | Yamagata | |
| 6,682,963 B2 | 1/2004 | Ishikawa | |
| RE38,466 E | 3/2004 | Inoue et al. | |
| 6,700,631 B1 | 3/2004 | Inoue et al. | |
| 6,720,203 B2 | 4/2004 | Carcia et al. | |
| 6,737,717 B2 | 5/2004 | Yamazaki et al. | |
| 6,744,116 B1 | 6/2004 | Doyle | |
| 6,756,286 B1 | 6/2004 | Moriceau et al. | |
| 6,781,152 B2 | 8/2004 | Yamazaki | |
| 6,787,887 B2 | 9/2004 | Yamazaki | |
| 6,797,414 B2 | 9/2004 | Sakaguchi | |
| 6,806,918 B2 | 10/2004 | Akiyama | |
| 6,811,945 B2 | 11/2004 | Kobayashi | |
| 6,814,832 B2 | 11/2004 | Utsunomiya | |
| 6,818,530 B2 | 11/2004 | Shimoda et al. | |
| 6,825,820 B2 | 11/2004 | Yamazaki et al. | |
| 6,828,214 B2 | 12/2004 | Notsu et al. | |
| 6,852,653 B2 | 2/2005 | Yamazaki et al. | |
| 6,878,607 B2 | 4/2005 | Inoue et al. | |
| 6,885,389 B2 | 4/2005 | Inoue et al. | |
| 6,893,980 B1 | 5/2005 | Akasaka et al. | |
| 6,916,681 B2 | 7/2005 | Asano et al. | |
| 6,946,361 B2 | 9/2005 | Takayama et al. | |
| 6,955,973 B2 | 10/2005 | Niwa | |
| 6,995,973 B2 | 2/2006 | Barsun et al. | |
| 7,005,798 B2 | 2/2006 | Carcia et al. | |
| 7,008,701 B2 | 3/2006 | Notsu et al. | |
| 7,034,381 B2 | 4/2006 | Yamazaki | |
| 7,045,438 B2 | 5/2006 | Yamazaki et al. | |
| 7,045,442 B2 | 5/2006 | Maruyama et al. | |
| 7,050,125 B2 | 5/2006 | Akiyama | |
| 7,060,153 B2 | 6/2006 | Yamazaki et al. | |
| 7,067,926 B2 | 6/2006 | Yamazaki et al. | |
| 7,091,070 B2 | 8/2006 | Imai et al. | |
| 7,094,665 B2 | 8/2006 | Shimoda et al. | |
| 7,098,088 B2 | 8/2006 | Yamazaki et al. | |
| 7,119,364 B2 | 10/2006 | Yamazaki | |
| 7,122,445 B2 | 10/2006 | Takayama et al. | |
| 7,147,740 B2 | 12/2006 | Takayama et al. | |
| 7,179,693 B2 | 2/2007 | Asano et al. | |
| 7,189,631 B2 | 3/2007 | Yamazaki et al. | |
| 7,189,999 B2 | 3/2007 | Yamazaki et al. | |
| 7,214,555 B2 | 5/2007 | Yamazaki et al. | |
| 7,271,858 B2 | 9/2007 | Yamazaki et al. | |
| 7,332,381 B2 | 2/2008 | Maruyama et al. | |
| 7,335,573 B2 | 2/2008 | Takayama et al. | |
| 7,351,300 B2 | 4/2008 | Takayama et al. | |
| 7,375,006 B2 | 5/2008 | Takayama et al. | |
| 7,407,870 B2 | 8/2008 | Maruyama et al. | |
| 7,410,847 B2 | 8/2008 | Yamazaki et al. | |
| 7,453,089 B2 | 11/2008 | Yamazaki et al. | |
| 7,550,326 B2 | 6/2009 | Asano et al. | |
| 7,612,753 B2 | 11/2009 | Koyama | |
| 7,633,471 B2 | 12/2009 | Yamazaki et al. | |
| 7,639,248 B2 | 12/2009 | Yamazaki et al. | |
| 7,723,209 B2 | 5/2010 | Maruyama et al. | |
| 8,106,407 B2 | 1/2012 | Yamazaki et al. | |
| 8,247,246 B2 | 8/2012 | Maruyama et al. | |
| 8,284,138 B2 | 10/2012 | Yamazaki et al. | |
| 8,427,246 B2 | 4/2013 | Lee et al. | |
| 8,436,846 B2 | 5/2013 | Yamazaki et al. | |
| 8,497,516 B2 | 7/2013 | Yamazaki et al. | |
| 8,669,925 B2 | 3/2014 | Yamazaki et al. | |
| 8,691,604 B2 * | 4/2014 | Maruyama | H01L 27/1214 257/E33.053 |
| 8,735,899 B2 | 5/2014 | Yamazaki et al. | |
| 9,263,697 B2 | 2/2016 | Yamazaki et al. | |
| 2002/0001921 A1 | 1/2002 | Fukunaga | |
| 2002/0024096 A1 | 2/2002 | Yamazaki et al. | |
| 2002/0044111 A1 | 4/2002 | Yamazaki et al. | |
| 2002/0146893 A1 | 10/2002 | Shimoda et al. | |
| 2003/0008437 A1 | 1/2003 | Inoue et al. | |
| 2003/0032210 A1 | 2/2003 | Takayama et al. | |
| 2003/0207488 A1 | 11/2003 | Carcia et al. | |
| 2003/0224582 A1 | 12/2003 | Shimoda et al. | |
| 2004/0164302 A1 | 8/2004 | Arai et al. | |
| 2004/0169786 A1 | 9/2004 | Yamazaki et al. | |
| 2004/0219762 A1 | 11/2004 | Shimoda et al. | |
| 2006/0030122 A1 | 2/2006 | Shimoda et al. | |
| 2006/0212945 A1 | 9/2006 | Donlin et al. | |
| 2007/0010067 A1 | 1/2007 | Shimoda et al. | |
| 2007/0082430 A1 | 4/2007 | Yamazaki | |
| 2013/0229117 A1 | 9/2013 | Yamazaki et al. | |

FOREIGN PATENT DOCUMENTS

| | | |
|---|---|---|
| DE | 69615510 | 5/2002 |
| DE | 69931130 | 11/2006 |
| EP | 0777280 A | 6/1997 |
| EP | 0858110 A | 8/1998 |
| EP | 0924769 A | 6/1999 |
| EP | 0989614 A | 3/2000 |
| EP | 1014452 A | 6/2000 |
| EP | 1122794 A | 8/2001 |

(56) References Cited

FOREIGN PATENT DOCUMENTS

| | | | |
|---|---|---|---|
| EP | 1248294 | A | 10/2002 |
| EP | 1351308 | A | 10/2003 |
| EP | 1363319 | A | 11/2003 |
| EP | 1435653 | A | 7/2004 |
| EP | 1686626 | A | 8/2006 |
| JP | 61-231714 | A | 10/1986 |
| JP | 09-161967 | A | 6/1997 |
| JP | 10-125929 | A | 5/1998 |
| JP | 10-125930 | A | 5/1998 |
| JP | 10-125931 | A | 5/1998 |
| JP | 11-020360 | A | 1/1999 |
| JP | 11-243209 | A | 9/1999 |
| JP | 11-312811 | A | 11/1999 |
| JP | 2000-156504 | A | 6/2000 |
| JP | 2000-231118 | A | 8/2000 |
| JP | 2001-007340 | A | 1/2001 |
| JP | 2001-100661 | A | 4/2001 |
| JP | 2001-125138 | A | 5/2001 |
| JP | 2001-155134 | A | 6/2001 |
| JP | 2001-166301 | A | 6/2001 |
| JP | 2001-189460 | A | 7/2001 |
| JP | 2001-331120 | A | 11/2001 |
| JP | 2002-033464 | A | 1/2002 |
| JP | 2002-049333 | A | 2/2002 |
| JP | 2002-151253 | A | 5/2002 |
| JP | 2002-151276 | A | 5/2002 |
| JP | 2002-184959 | A | 6/2002 |
| JP | 2002-217391 | A | 8/2002 |
| JP | 2002-305293 | A | 10/2002 |
| JP | 2002-367780 | A | 12/2002 |
| JP | 2002-543563 | | 12/2002 |
| JP | 2004-214281 | A | 7/2004 |
| JP | 2004-237655 | A | 8/2004 |
| KR | 10-0420749 | | 5/2004 |
| TW | 412774 | | 11/2000 |
| TW | 447146 | | 7/2001 |
| WO | WO-1999/044242 | | 9/1999 |
| WO | WO-2000/065670 | | 11/2000 |
| WO | WO-2000/075978 | | 12/2000 |
| WO | WO-2002/084739 | | 10/2002 |

OTHER PUBLICATIONS

Auberton-Herve.A et al., "Unibond SOI Wafer by Smart Cut", Electronic Material, Aug. 1, 1997, vol. 36, No. 8, pp. 83-87, Industrial Research Society (Kogyo Chosa Kai).
Search Report (Application No. 03015816.6) dated Jul. 21, 2005.
Office Action (Application No. 200310124242.3) dated May 9, 2008.
Office Action (Application No. 92136257) dated Sep. 17, 2009.
Taiwanese Office Action (Application No. 98127268) dated May 7, 2013.
Taiwanese Office Action (Application No. 104128393) dated Dec. 27, 2016.
European Search Report (Application No. 03029755.0) dated Nov. 15, 2017.

* cited by examiner

| Element | Counts | wt% | Atom% |
|---|---|---|---|
| O | 48 | 6.26 | 43.40 |
| W | 1277 | 93.74 | 56.60 |

| Element | Counts | Wt% | Atom% |
|---|---|---|---|
| O | 62 | 8.90 | 52.88 |
| W | 1127 | 91.10 | 47.12 |

⊢—⊣ 10 nm

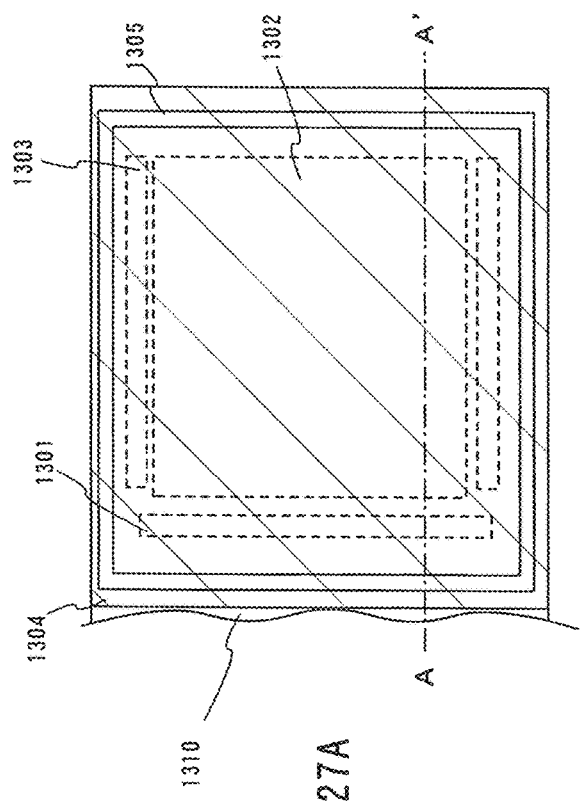
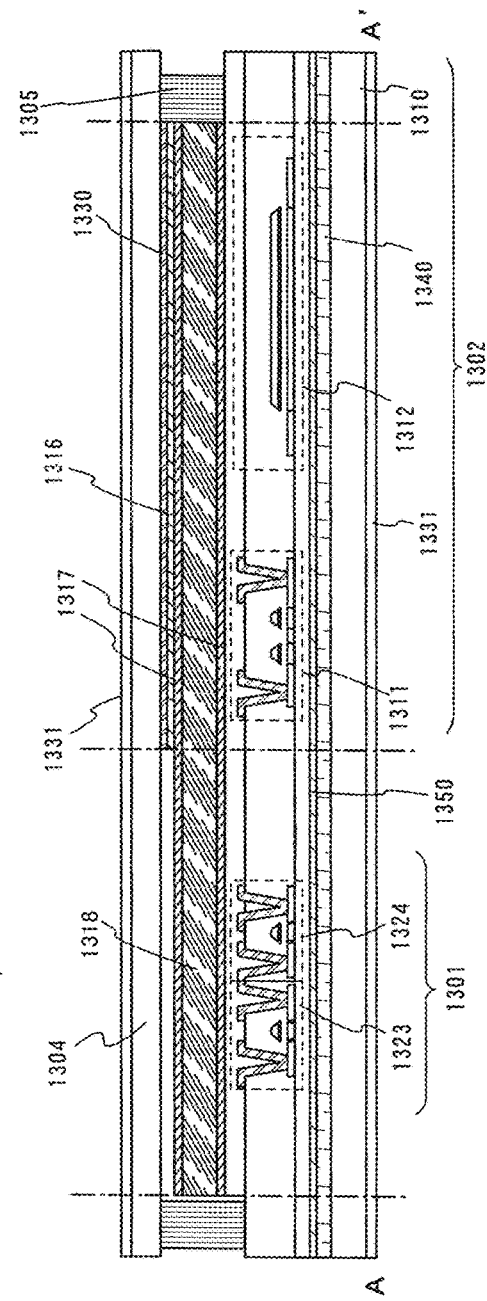
Fig. 27A
Fig. 27B

SEMICONDUCTOR DEVICE AND MANUFACTURING METHOD THEREOF, DELAMINATION METHOD, AND TRANSFERRING METHOD

BACKGROUND OF THE INVENTION

1. Field of the Invention

The present invention relates to a delamination method of a functional thin film, particularly to a delamination method of a film or a layer each of which is provided with various elements. In addition, the present invention relates to a transferring method for pasting a separated film to a film substrate, and further relates to a semiconductor device comprising a thin film transistor (hereinafter referred to as a TFT), which is formed in accordance with the transferring method, and to a manufacturing method thereof.

2. Description of the Related Art

Recently, a technique for forming a TFT by using a semiconductor thin film (with a thickness of about several nanometers to several hundred nanometers) formed over a substrate provided with an insulating surface is attracting attention. A TFT is widely applied to an electronic device such as an IC or an electro-optic device, and is developed especially as a switching element or a driver circuit of a display device.

Such display devices can be mass-produced by performing dicing for obtaining multiple panels. Glass substrates and quartz substrates are mostly used; however, they have disadvantages of fragility and heaviness to be enlarged. Therefore, forming a TFT element on a flexible substrate typified by a flexible plastic film is being tested.

However, when a sophisticated polysilicon film is used for an active layer of a TFT; a process at a high temperature at several hundred degrees centigrade is necessary in a manufacturing process, so that the polysilicon film can not be formed directly on a plastic film.

Therefore, a method of separating a delamination layer from the substrate by using a separation layer in between is proposed. For example, a separation layer comprising such as amorphous silicon, a semiconductor, nitride ceramics, or an organic polymer is provided and exposed to a laser beam through the substrate; the substrate is separated by a delamination or the like in the separation layer (Reference 1: Japanese Patent Laid-open Publication No. 10-125929). In addition, a reference describes an example of completing a liquid crystal display device by pasting a delamination layer (referred to as a layer to be transferred) to a plastic film (Reference 2: Japanese Patent Laid-open Publication No. 10-125930). Techniques of respective companies are introduced in the articles on flexible displays (Reference 3: Nikkei Microdevices, Nikkei Business Publications, pp. 71-72, Jul. 1, 2002).

However, in the method described in the above publications, it is required to use a substrate which is highly transparent to light. Further, a rather high-energy laser beam is necessary for imparting sufficient energy to release hydrogen included in amorphous silicon through a substrate. That causes a problem of damage to a delamination layer. Further, the above publication describes a structure in which a light-resistant layer or a reflective layer is provided to prevent the damage to the delamination layer; however, in that case, it is difficult to fabricate a transmissive liquid crystal display device or a light emitting device which emits light downward. Still further, with the above method, it is difficult to separate a delamination layer having a large area.

SUMMARY OF THE INVENTION

The present invention has been made in view of the above problems and it is an object of the present invention to provide a technique for performing separation between a substrate and a delamination layer by a physical means or a mechanical means in a state where a metal film formed over a substrate, and a delamination layer comprising an oxide film including the aforementioned metal and a film comprising silicon, which is formed over the metal film, are provided. Specifically, a obtained by forming an oxide layer including the aforementioned metal over a metal film; crystallizing the aforementioned oxide layer by heat treatment; and performing delamination in a layer of the oxide layer or at the interfaces of both surfaces of the aforementioned oxide layer is formed.

A TFT formed according to the present invention can be applied to any light emitting device of top emission type or bottom emission type; or to any liquid crystal display device of transmissive type, reflective type, or semi-transmissive type; or the like.

BRIEF DESCRIPTION OF THE DRAWINGS

FIGS. 27A and 27B show a liquid crystal display device formed according to the present invention.

DETAILED DESCRIPTION OF THE PREFERRED EMBODIMENTS

Referring to the accompanying drawings, a description is made to explain embodiment modes according to the present invention.

Embodiment Mode 1

Figure 1A:
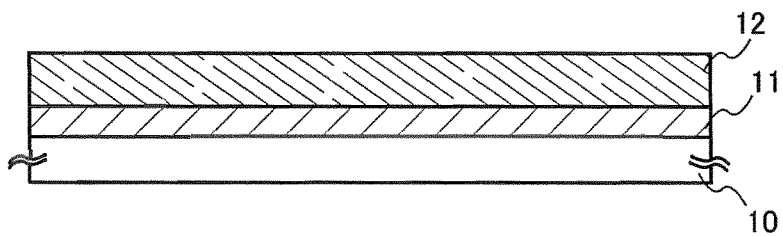
FIGS. 1A to 1E show a delamination process according to the present invention.

First, a metal film 11 is formed on a first substrate 10 as shown in FIG. 1A. Note that, any substrate that has rigidity for withstanding the lamination process thereafter, for example, a glass substrate, a quartz substrate, a ceramic substrate, a Si substrate, a metal substrate, or a stainless substrate, can be used for the first substrate. An element selected from the group consisting of W, Ti, Ta, Mo, Nd, Ni, Co, Zr, Zn, Ru, Rh, Pd, Os, and Ir; a single layer mainly comprising an alloy material or a compound material thereof; or a lamination thereof, can be used for the metal film. The metal film may be formed over the first substrate by sputtering using a metal as a target. Note that, the film thickness of the metal film shall be 10 nm to 200 nm, preferably be 50 nm to 75 nm.

Instead of a metal film, a metal film which is nitrided (metal nitride film) may be used. Nitrogen and oxygen may be added further to the metal film. For example, ion implantation of nitrogen or oxygen to metal film may be performed, or the metal film may be formed by sputtering in a film formation chamber which shall be a nitrogen or oxygen atmosphere. Furthermore, nitride metal may be used as a target.

Hereupon, when a metal alloy of the aforementioned metal (for example, an alloy of W and Mo: $W_xMo_{1-x}$) is used for the metal film, plural targets such as a first metal (W) and a second metal (Mo), or a target of an alloy of the first metal (W) and the second metal (Mo) is disposed in a film formation chamber, thereby forming the metal film by sputtering.

When the metal film is formed by sputtering, the film thickness of the periphery of the substrate occasionally becomes uneven. Therefore, it is preferable to remove a film of the periphery portion by dry etching; on that occasion, an insulating film such as a SiON film or a SiNO film may be formed into approximately 100 nm between the first substrate 10 and the metal film 11 so that the first substrate is not etched.

By setting the formation of metal film appropriately as above, the delamination process can be controlled, and a range of process is broadened. For example, when a metal alloy is used, use or disuse of heat treatment as well as the temperature of heat treatment can be controlled by controlling composition ratio in each metal of the alloy.

A delamination layer 12 is formed over the metal film 11. The delamination layer has an oxide film for forming an oxide layer including the aforementioned metal over the metal film 11, and a semiconductor film. The semiconductor film of the delamination layer may be in a state where a TFT, an organic TFT, a thin film diode, a photoelectric transducer comprising PIN junctions of Si, a silicon resistor, a sensor element (typically, a pressure-sensitive fingerprint scanner using polysilicon) or the like is formed in a desired manufacturing process.

Silicon oxide, silicon oxynitride or the like can be formed by a sputtering method or a CVD method as the oxide film. Incidentally, a thickness of the oxide film is preferably two times larger than that of the metal film 11. Here, by sputtering using a Si target, a silicon oxide film is formed with a film thickness of 150 nm to 200 nm.

In the present invention, when an oxide film is formed, the oxide layer including the aforementioned metal is formed over the metal film (not illustrated). The oxide layer may be formed into a film thickness of 0.1 nm to 1 μm, preferably 0.1 nm to 100 nm, further preferably 0.1 nm to 5 nm.

Another method for forming the oxide layer aside from the above can use a thin oxide film formed by processing an aqueous solution having sulfuric acid, hydrochloric acid or nitric acid; an aqueous solution in which sulfuric acid, hydrochloric acid or nitric acid and hydrogen peroxide water are mixed; or ozone aqua. As yet another alternative, oxidation may be performed by plasma treatment in an oxygen atmosphere or by generating ozone with ultraviolet irradiation in an oxygen containing atmosphere, or, a thin oxide film may be formed by heating approximately at 200° C. to 350° C. with a clean oven.

In the delamination layer 12, it is preferable that an insulating film comprising a nitride such as SiN, or SiON be provided as a base film particularly under a semiconductor film to prevent immersion of impurities or garbage penetrating the exterior of a metal film or a substrate.

Thereafter, heat treatment is performed at 380° C. to 410° C., 400° C., for example. By the heat treatment, the oxide layer is crystallized, and the hydrogen contained in the delamination layer 12, particularly, hydrogen of a semiconductor film is diffused. Heat treatment in a process for manufacturing a semiconductor device may be performed concurrently with heat treatment for the above step thereby reducing the number of the processes. When an amorphous semiconductor film is formed and a crystalline semiconductor film is formed by using a heating furnace or by laser irradiation, heat treatment at least at 500° C. may be performed for the crystallization, thus diffusing hydrogen as well as forming a crystalline semiconductor film.

Figure 1B:
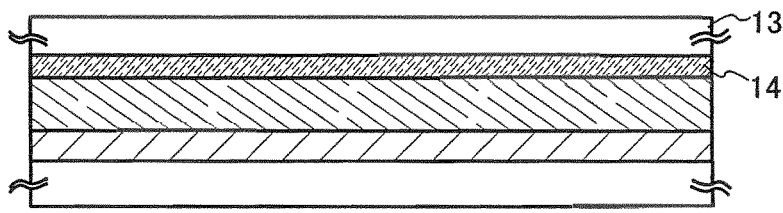

A second substrate 13 which fixes the delamination layer 12 is pasted to the delamination layer 12 with a first adhesive material (binding material) 14 as shown in FIG. 1B. Note that, it is preferable that a substrate with rigidity which is higher than that of the first substrate 10 be used for the second substrate 13. For example, a peelable adhesive such as ultra violet peelable adhesive, which is removed with ultra violet rays, or a heat peelable adhesive, which is removed with heat; a water-soluble adhesive; or a two-sided tape may preferably be employed for the first binding material 14.

Figure 1C:
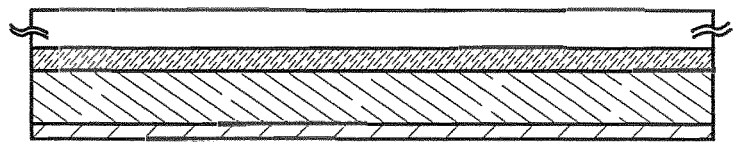

Next, the first substrate 10 provided with the metal film 11 is separated by using physical means (FIG. 1C). The separation occurs in a layer of the crystallized oxide layer or at the interfaces of both surfaces of the oxide layer, that is, at the interface between the oxide layer and the metal film or at the interface between the oxide layer and the delamination layer; although it is not illustrated since a figure shows a frame format. Thus, the delamination layer 12 can be separated from the first substrate 10.

Figure 1D:
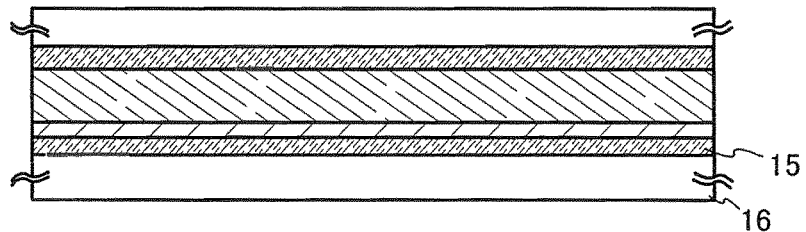

As shown in FIG. 1D, the separated delamination layer 12 is pasted to the third substrate 16 which is to be a transfer body, by the second binding material 15. An ultraviolet curable resin such as an epoxy resin adhesive, a resin additive, a two-sided tape, or the like may be used for the second binding material 15. Note that, when the surface of the third substrate is adhesive, the second binding material may not necessarily be used. Further, the side surfaces of the delamination layer 12 may also be covered with the third substrate. A substrate with flexibility and thin film thickness (such a substrate is hereinafter referred to as a film substrate), for example, a plastic substrate such as a substrate of polycarbonate, polyarylate, polyethersulfone; polytetrafluoro-ethylene substrate; or ceramic substrate may be used for the third substrate 16.

Figure 1E:
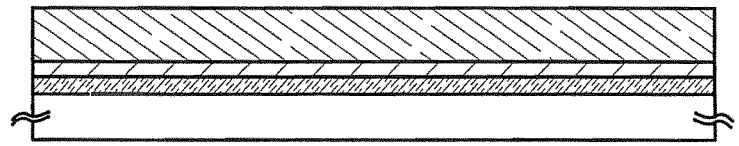

Subsequently, the first binding material 14 is removed and the second substrate 13 is delaminated (FIG. 1E). Specifically, ultraviolet irradiation, heat treatment, or water washing may be performed to peel the first binding material. Further, it is preferable to perform plasma cleaning using argon gas and oxygen gas, or bellclean cleaning.

Plural delamination layers provided with TFTS that suit each usage may be transferred to the third substrate which is to be a transfer body. For example, a delamination layer of a TFT for a pixel area and a TFT for a driver circuit may be formed, and transferred to a predetermined area of the third substrate thereafter.

A TFT and the like which are formed on the film substrate obtained as above can be employed as a semiconductor element of a light emitting device or of a liquid crystal display device.

A light emitting device is formed by forming a light emitting element on the delamination layer 12 and forming a protective film which is to be an encapsulant thereafter. When a light emitting element is formed on the delamination layer 12, since the film substrate provided with a TFT is flexible, the delamination layer may be fixed to another glass substrate using a binding material such as a tape thereby forming each light emitting layer by vacuum deposition. Note that, it is preferable that a light emitting layer, an electrode and a protective film are sequentially formed without being exposed to the atmosphere.

The order for making a light emitting device is not limited particularly, and the following order may be adopted: a light emitting element is formed over a delamination layer; the second substrate is adhered; the delamination layer having light emitting element is separated, and it is pasted to the film substrate which serves as the third substrate. Further, after the formation of the light emitting element, the whole device may be wrapped in a film substrate designed larger, which serves as the third substrate.

When a liquid crystal display device is manufactured, a counter substrate is adhered with a sealing material after the separation of the second substrate, and a liquid crystal material may be injected in between. The order for making a liquid crystal display device is not limited particularly, and the following order may also be employed: the second substrate is adhered as a counter substrate; the third substrate is adhered; and a liquid crystal is injected in between, may be employed.

When a liquid crystal display device is manufactured, generally, spacers are formed or sprinkled to maintain a substrate gap; however, spacers with around 3 times the amount may be formed or sprinkled to maintain a gap between a flexible substrate and the counter substrate. Further, the spacers are preferably formed more softly than that are applied to a general glass substrate. Still further, it is necessary to fix the pacers so as not to move since a film substrate is flexible.

By applying such a delamination method, a TFT and the like can be formed on a flexible film substrate achieving delamination in the whole surface and high yield. In addition, a burden caused by a laser or the like are not placed on a TFT in the present invention. Thus, a light emitting device, a liquid crystal display device, or other display devices, which have the TFT and the like becomes thin, hard to be broken even if it drops, and lightweight. Further, display on a curved surface or in odd-shape becomes possible. A TFT provided on a film substrate, which is formed according the present invention can achieve the enlargement of display units as well as mass production. The present invention enables the recycling of the first substrate and achieves reducing costs of a display unit by employing a low-cost film substrate.

EMBODIMENTS

A experimental result of the present invention, a light emitting device manufactured according to the present invention, a liquid crystal display device, and other electronic devices will be described below.

Embodiment 1

In this embodiment, a result of a delamination experiment and an audit observation of a transmission electron microscope (TEM) will be described.

First, as to a sample shown in FIG. 2, an AN 100 glass substrate (126×126 mm$^2$) as a substrate and a film mainly consisting of tungsten (hereinafter referred to as a W film) deposited by sputtering as a metal film are laminated. Thereafter, a SiO$_2$ film deposited by sputtering as a protective film forming a delamination layer, a SiON film deposited by CVD as a base film, and an amorphous silicon film deposited by CVD as a semiconductor film are laminated thereover.

Among the above samples, one to which heat treatment is not performed shall be A, another to which heat treatment at 220° C. for one hour is performed shall be B, and the other to which heat treatment at 500° C. for one hour and heat treatment at 550° C. for four hours thereafter are performed shall be C. Each of the samples is observed with a TEM. The results are shown in FIGS. 3A to 5A. The frame formats corresponding to the respective TEM pictures (TEM images) are shown in FIGS. 3B to 5B.

It is found that a layer is formed at an interface between W film serving as a metal film 202 and a protective film 203. Note that, the layer is not always a complete layer, and is scattered in some cases.

An EDX measurement is performed to specify the composition of the layer. The spectrum and the quantitative result of the EDX measurement on samples A to C are shown in FIGS. 8A to 10B. Note that, the peaks of Al and Mo are due to the sample fixing holder during the measurement. The results in FIGS. 8A to 10B show the existence of tungsten and oxygen in the layer (hereinafter referred to as a oxide layer).

In comparing TEM pictures in FIGS. 3A to 5A, the oxide layer of sample C is found to have a crystalline lattice arranged in a specific direction. It is also found that the oxide layers of samples A and B have film thicknesses of approximately 3 nm; meanwhile, the oxide layer of sample C is formed to have a rather thinner thickness (3 nm at most).

Such results of the delamination experiment on samples A to C reveal that only sample C in which the oxide layer has a crystalline lattice can be separated.

Figure 2:
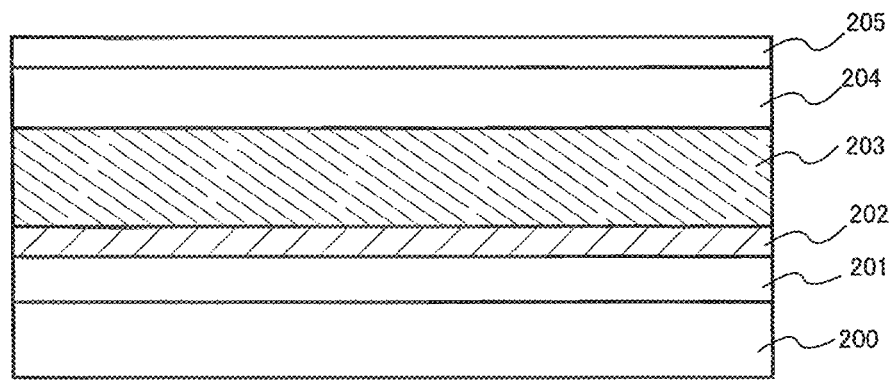
FIG. 2 shows an experimental sample in the present invention.
Figure 3A:
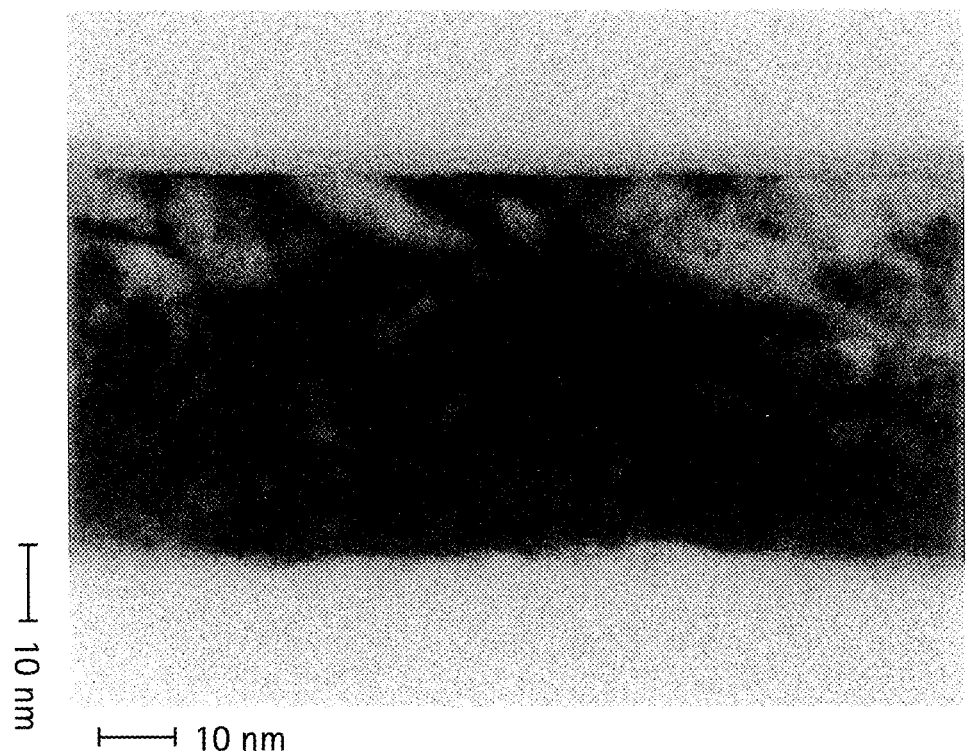
FIGS. 3A and 3B show a TEM picture and the frame format of experimental sample A in the present invention.
Figure 3B:
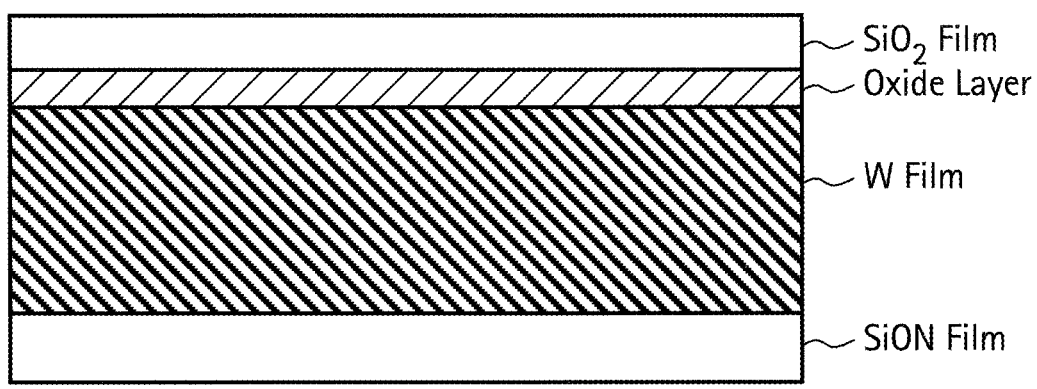
Figure 4A:
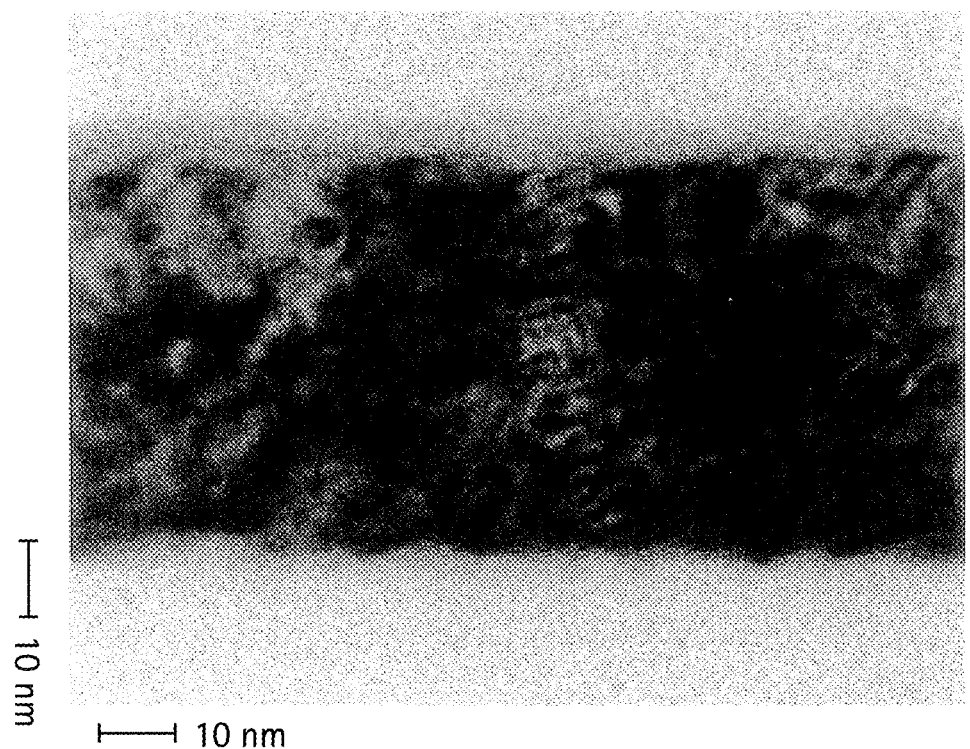
FIGS. 4A and 4B show a TEM picture and the frame format of experimental sample B in the present invention.
Figure 4B:
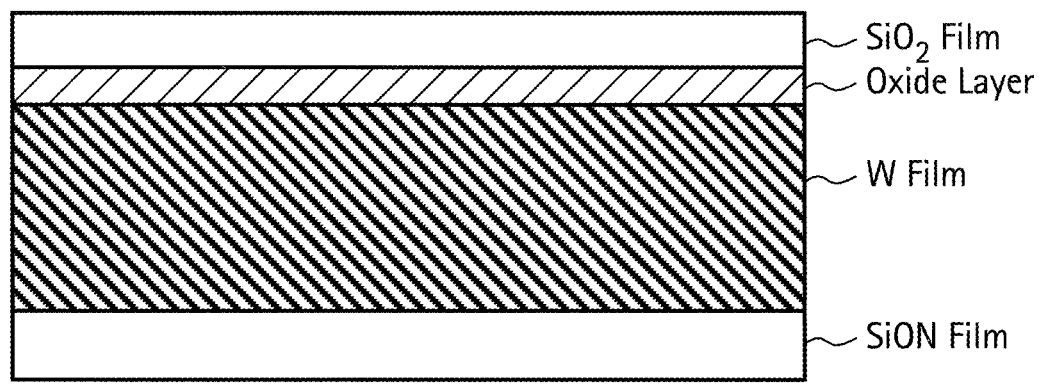
Figure 5A:
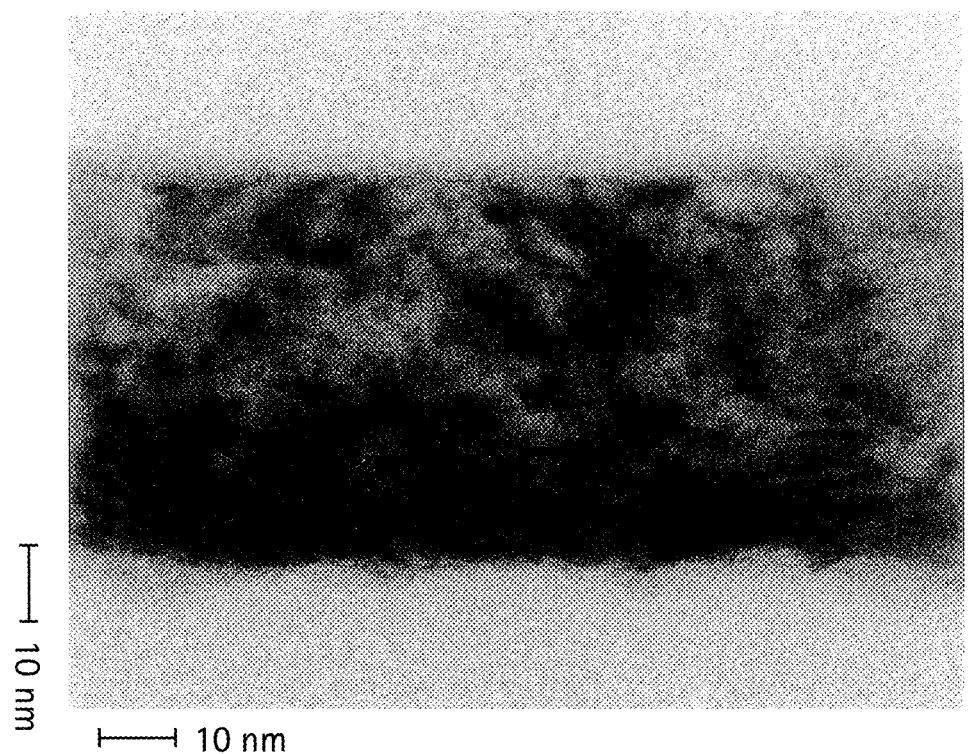
FIGS. 5A and 5B show a TEM picture and the frame format of experimental sample C in the present invention.
Figure 5B:
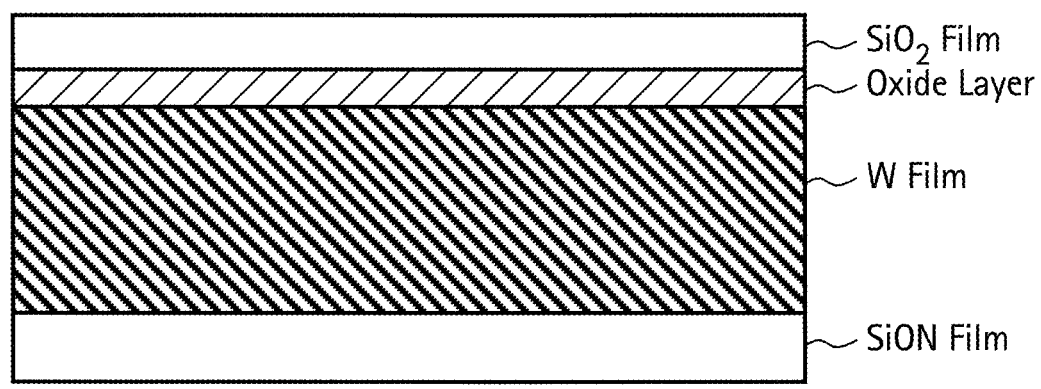
Figure 6A:
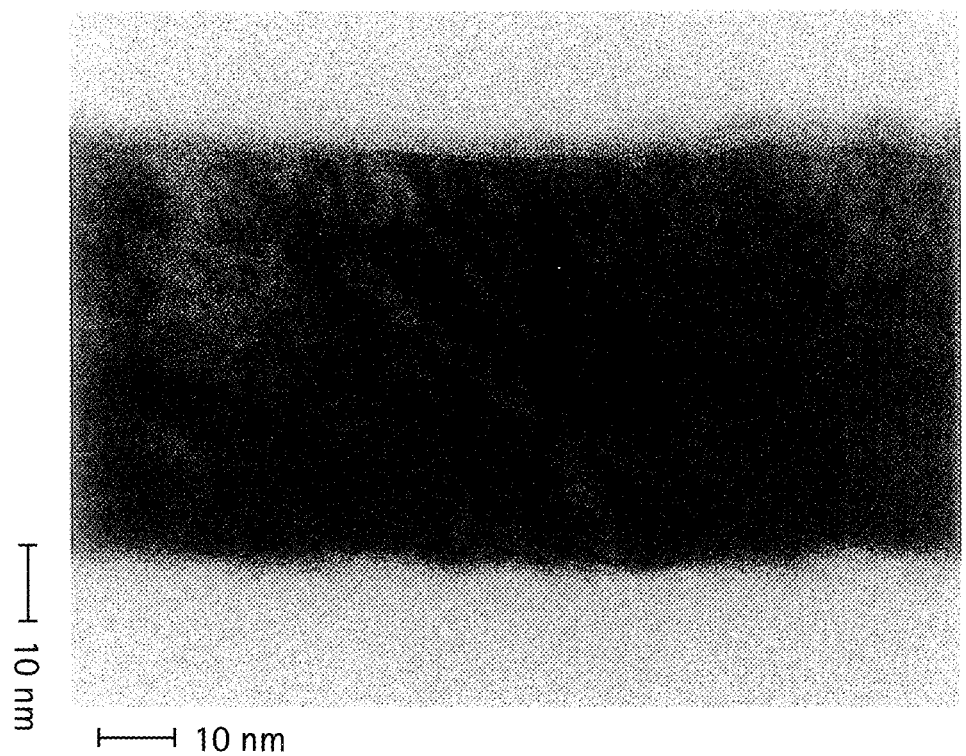
FIGS. 6A and 6B show a TEM picture and the frame format of experimental sample D in the present invention.
Figure 6B:
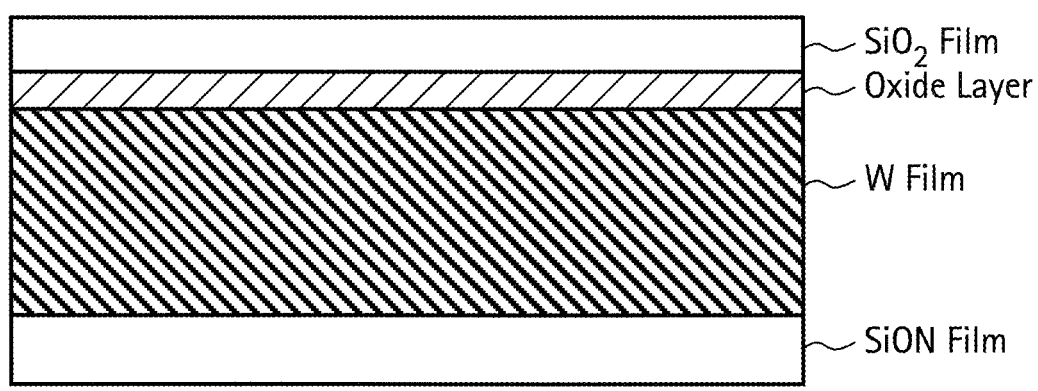
Figure 7A:
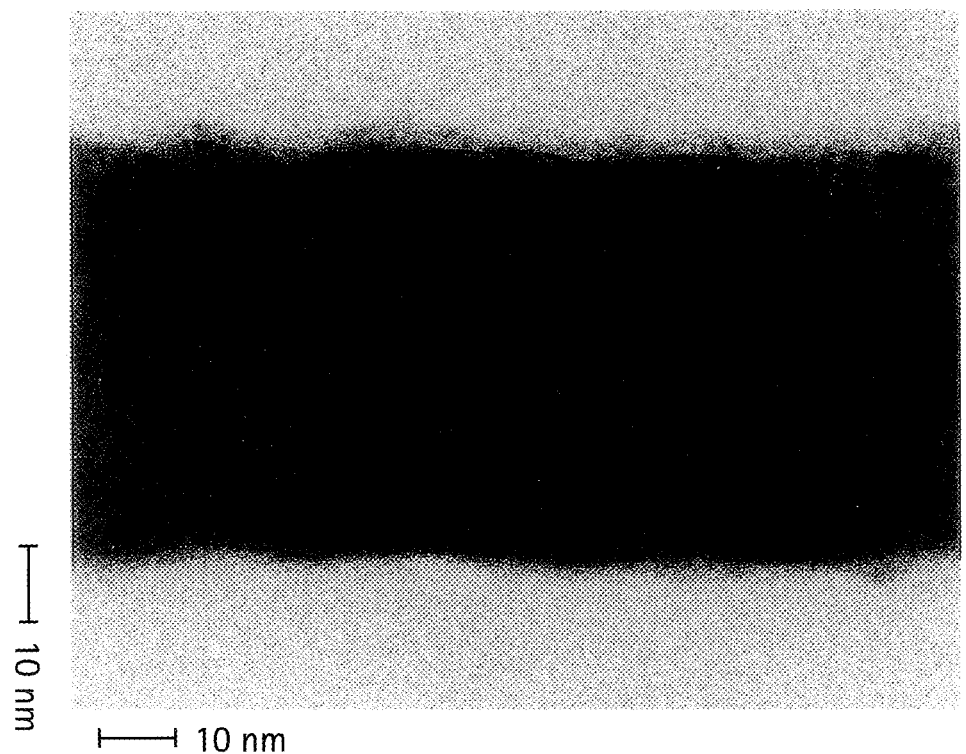
FIGS. 7A and 7B show a TEM picture and the frame format of experimental sample E in the present invention.
Figure 7B:
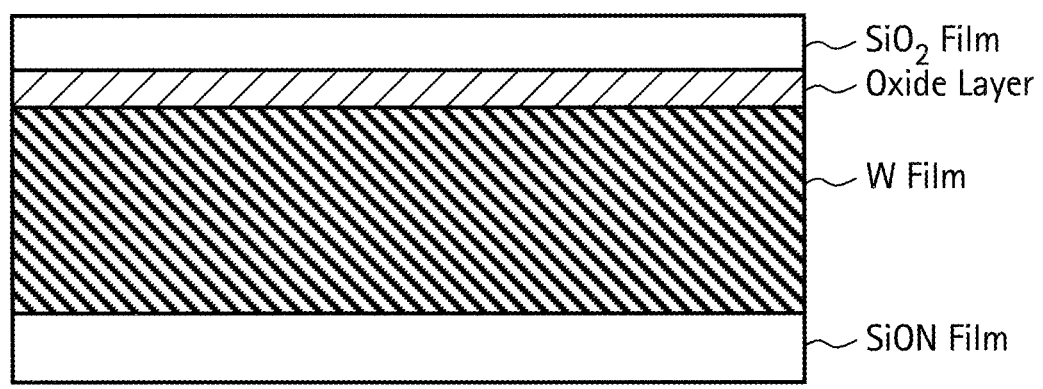
Figures 8A, 8B:
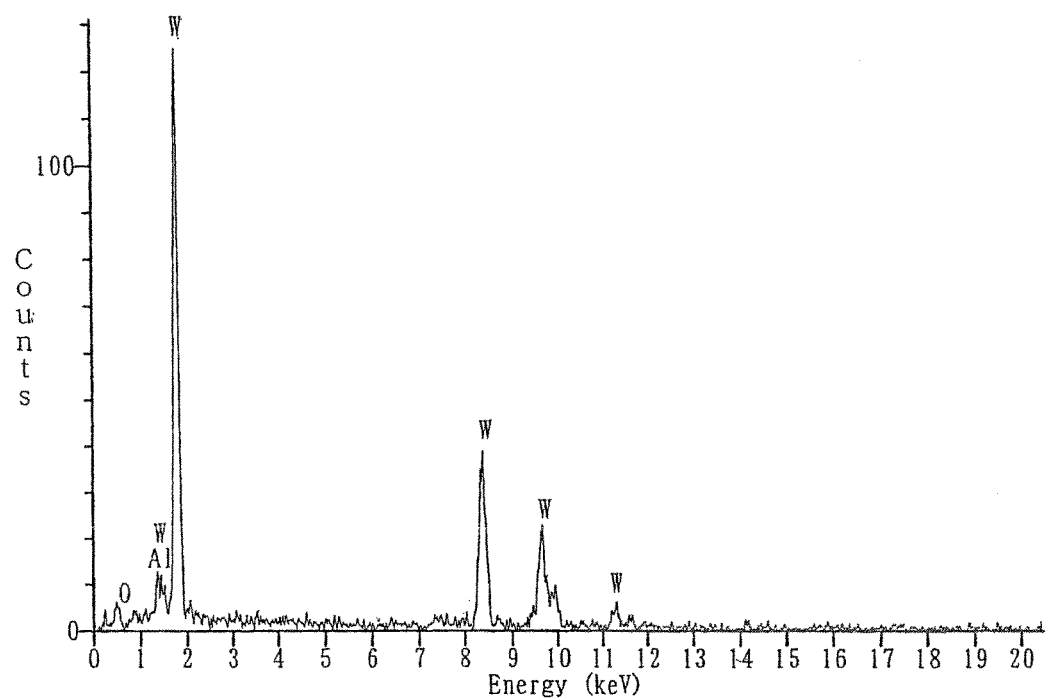
FIGS. 8A and 8B are a figure showing EDX spectrum and a quantitative result of experimental sample A in the present invention.
Figures 9A, 9B:
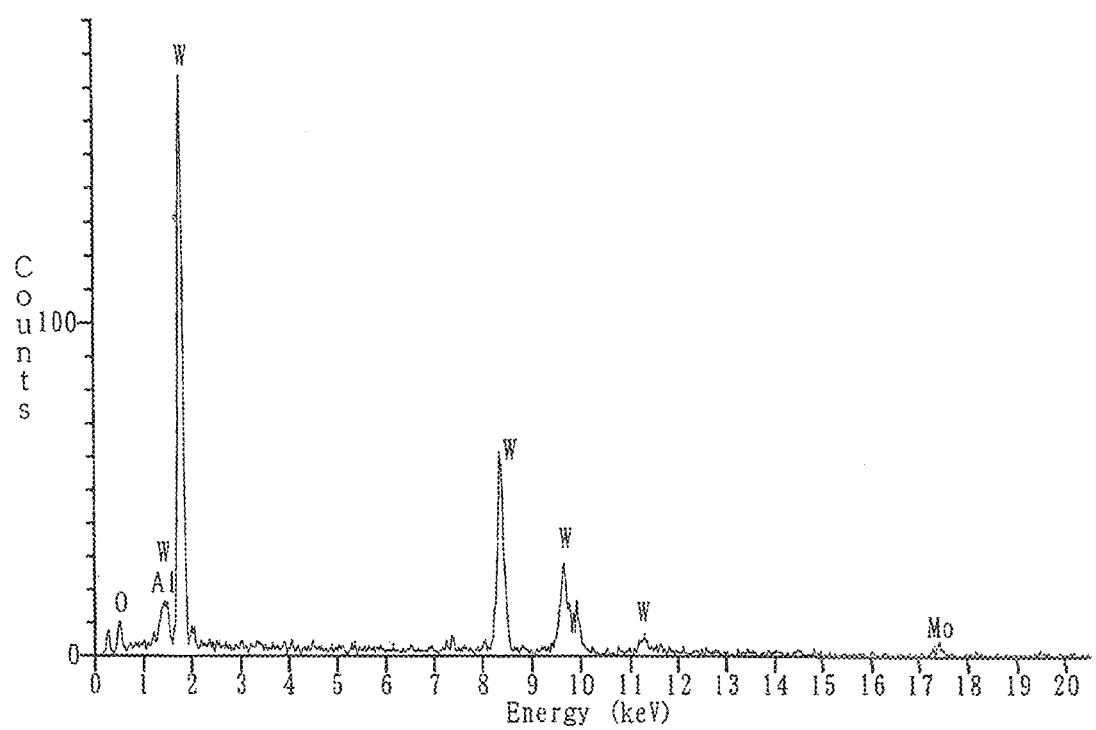
FIGS. 9A and 9B are a figure showing EDX spectrum and a quantitative result of experimental sample B in the present invention.
Figures 10A, 10B:
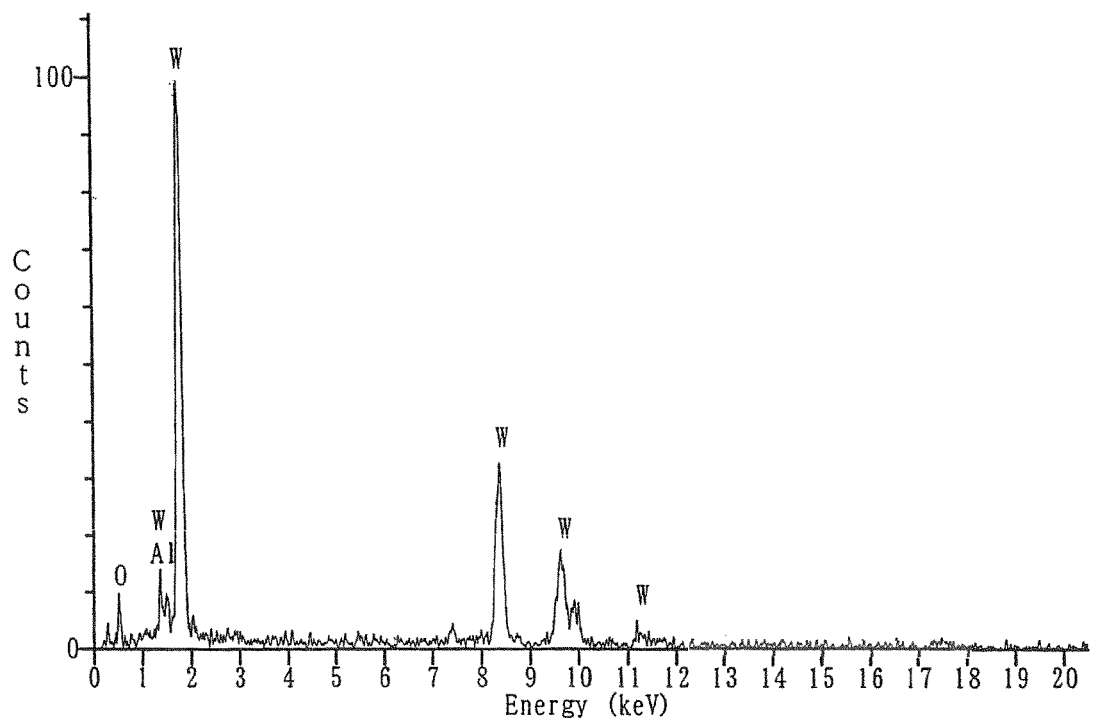
FIGS. 10A and 10B are a figure showing EDX spectrum and a quantitative result of experimental sample C in the present invention.

FIGS. 6A and 7A show TEM pictures of a sample shown in FIG. 2 after heat treatment at 400° C. for one hour, which is to be sample D and a sample shown in FIG. 2 after heat treatment at 430° C. for one hour, which is to be sample E. FIGS. 6B and 7B show frame formats corresponding to the respective TEM pictures. Note that, the temperature 400° C. which is applied to sample D is expected to be a boundary temperature of crystallization; that is a boundary temperature that can cause separation.

FIGS. 6A and 6B show that a crystalline lattice is formed on a part of the oxide layer in sample D and a crystalline lattice is formed wholly over the oxide layer in sample E.

As a result of the lamination experiments of the above samples D and E, only sample E is found to be separated.

The results of the above delamination experiment and TEM pictures reveal that an oxide layer is formed at the interface between a metal film and a protective film, and that the crystallization of the oxide film begins to occur approximately at 400° C. When the oxide layer has crystallinity, it is considered to be a state where separation may occur. Namely, it is found that an oxide film over a metal film, specifically, an oxide layer comprising W provided over a W film, needs to be formed.

Accordingly, since separation is possible in a sample wherein an oxide layer is crystallized, when the oxide film is crystallized by heat treatment, a crystal distortion, a lattice defect (point defect, line defect, plane defect (for example, plane defect due to crystallographic shear plane which is formed with congeries of oxygen vacancy), an expansion defect) generate, and separation is considered to occur form the interfaces thereof.

Embodiment 2

Next, a delamination experiment is carried out under a different condition for manufacturing the protective film, or as the absence or presence of the protective film on a W film is varied.

Figure 11A:
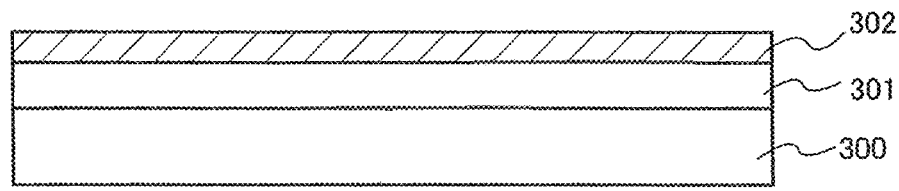
FIGS. 11A to 11D show experimental samples in the present invention.
Figure 11B:
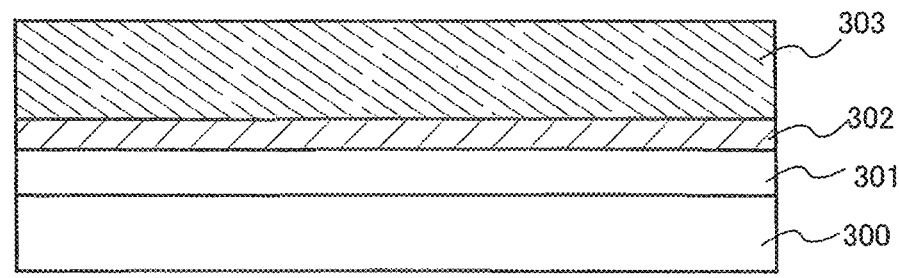
Figure 11C:
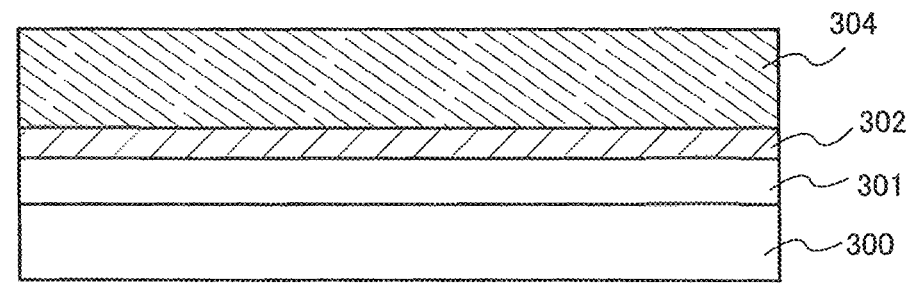
Figure 11D:
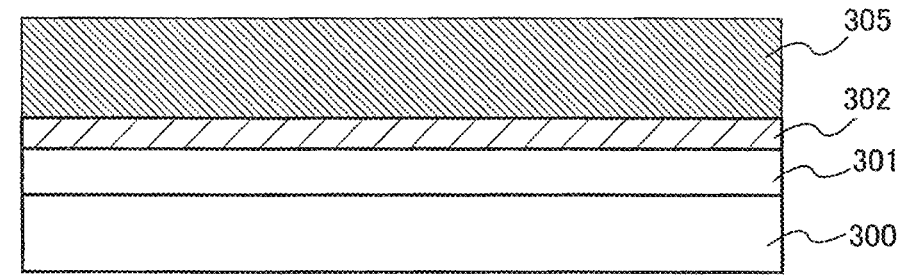
Figure 12A:
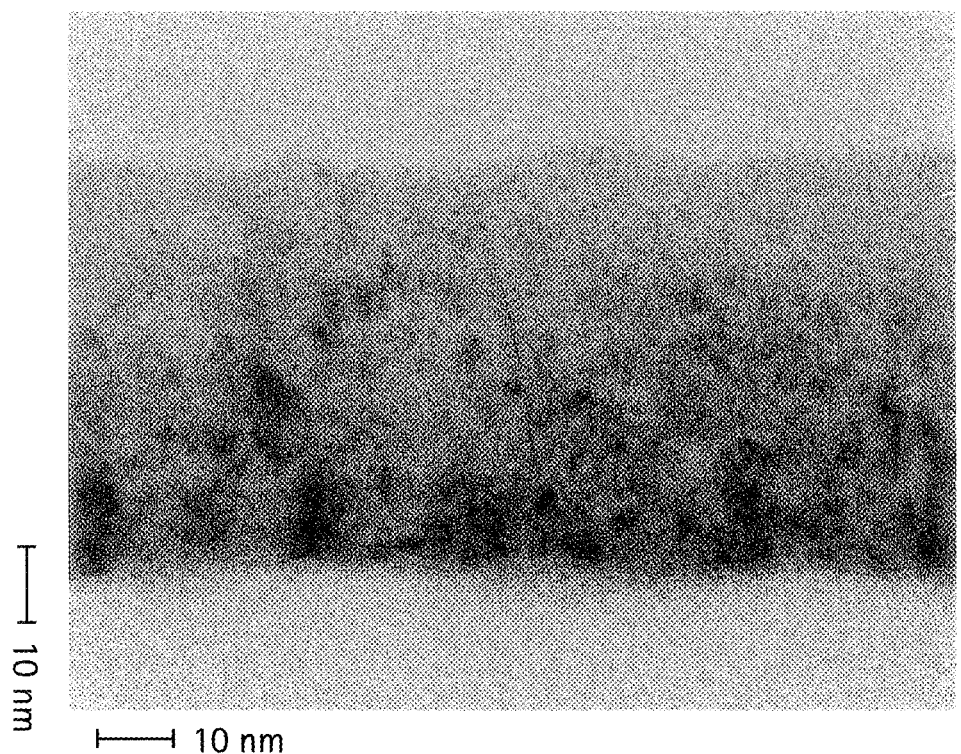
FIGS. 12A and 12B show a TEM picture and the frame format of experimental sample 1 in the present invention.
Figure 12B:
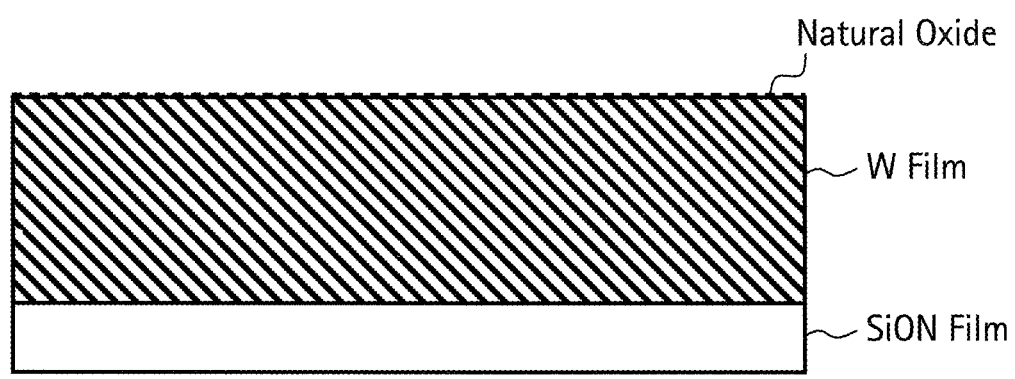
Figure 13A:
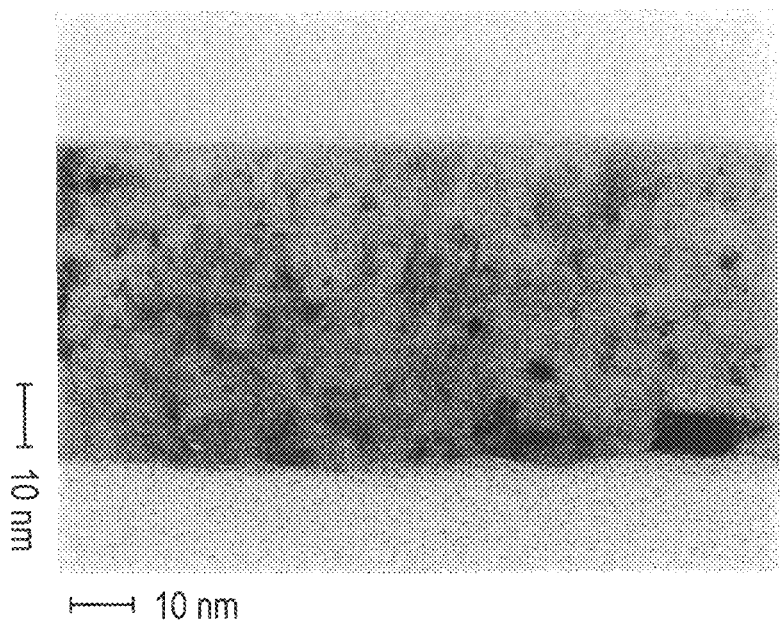
FIGS. 13A and 13B show a TEM picture and the frame format of experimental sample 2 in the present invention.
Figure 13B:
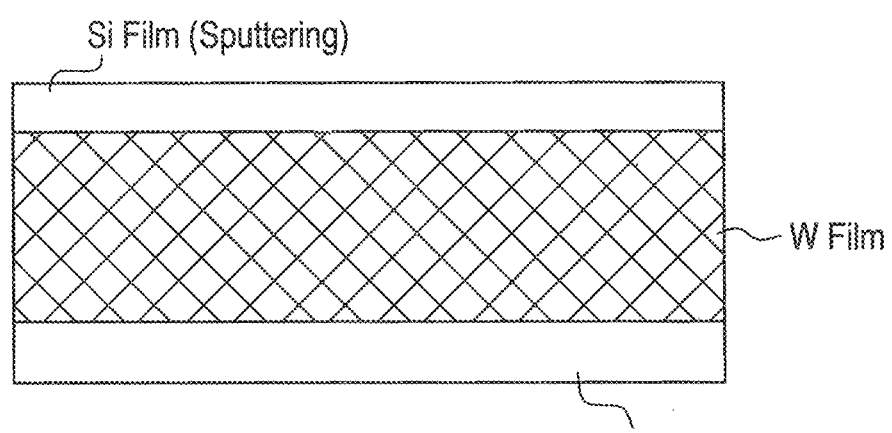
Figure 14A:
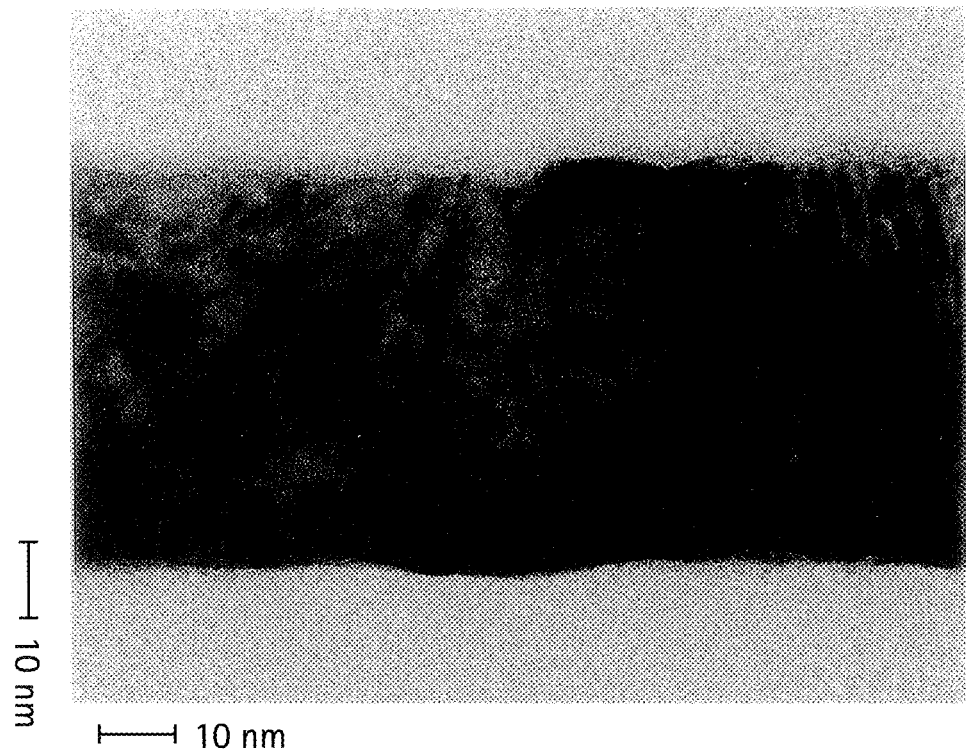
FIGS. 14A and 14B show a TEM picture and the frame format of experimental sample 3 in the present invention.
Figure 14B:
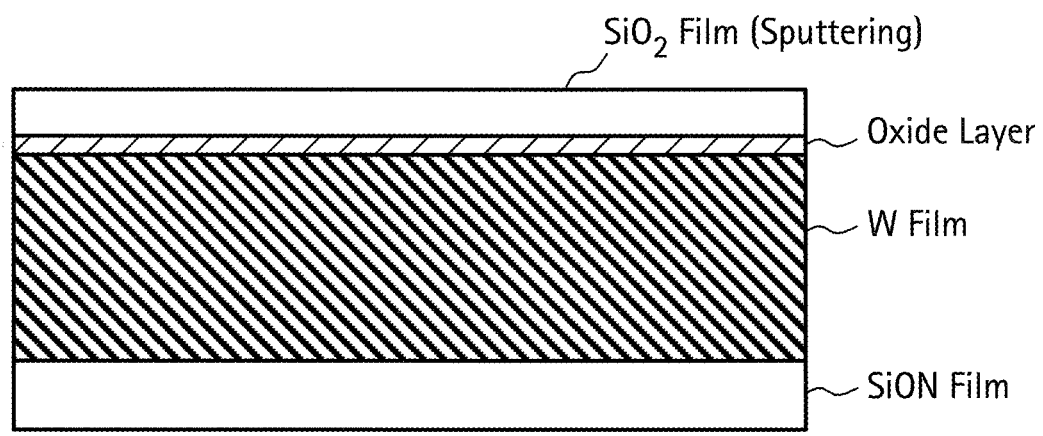

As shown in FIGS. 11A to 11D, the followings are prepared: sample 1 formed by sequentially laminating a SiON film 301 formed on a substrate 300 by CVD and a W film 302 formed by sputtering (FIG. 11A); sample 2 comprising a Si film 303 over a W film, formed by sputtering using argon gas, as a protective film (FIG. 11B); sample 3 comprising a SiO$_2$ film 304 formed by sputtering using argon gas and oxygen gas instead of Si film (FIG. 11C); and sample 4 comprising a SiO$_2$ film 305 formed by CVD using silane gas and nitrogen gas (FIG. 11D).

FIGS. 12A to 15A show TEM pictures of cross sections of respective samples 1 to 4. The frame formats corresponding to the respective TEM pictures are shown in FIGS. 12B to 15B.

As illustrated in FIGS. 12A to 15A, an oxide layer is formed over a W film in sample 3; however, an oxide layer is not formed in the other samples. Note that, a natural oxide film is formed in sample 1; however, the film thickness is so thin that the film is not clearly shown in the TEM picture.

The oxide layer is considered to be formed over the W film due to the oxygen gas employed when the sample 3 is formed. On the other hand, when the protective film is formed in sample 2, it is considered that only argon gas is used, so that an oxide layer is not formed on the W film. When the film thickness is considered, the oxide layer formed in sample 3 is thought to be different from the natural oxide film formed in sample 1. It is conceivable that the oxide layer is formed when the protective film begins to be formed.

Figure 15A:
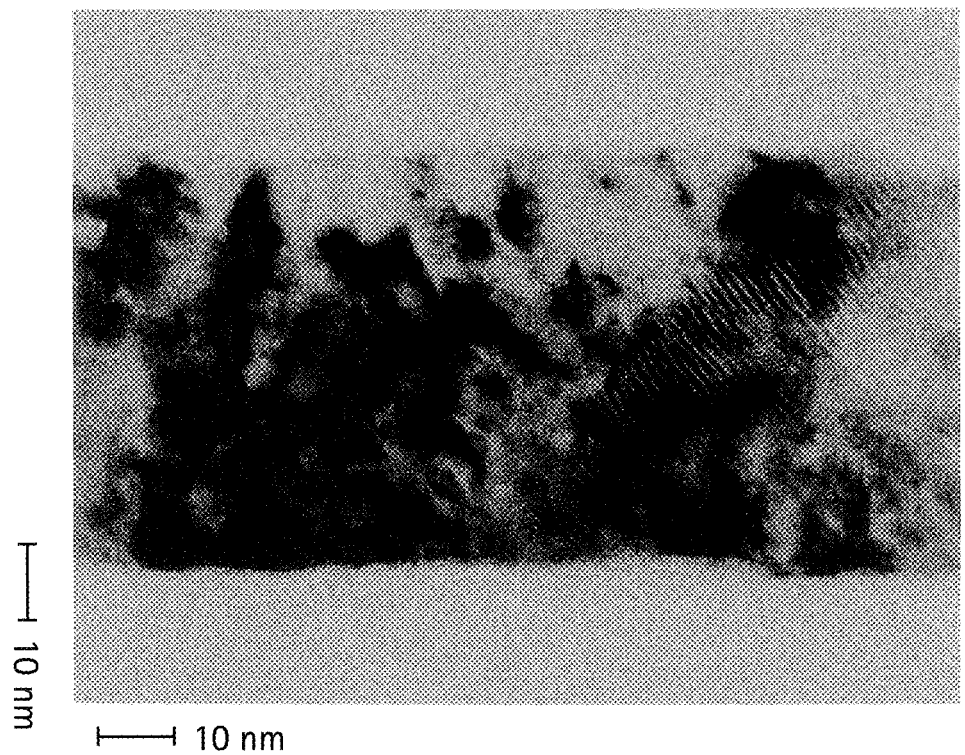
FIGS. 15A and 15B show a TEM picture and the frame format of experimental sample 4 in the present invention.
Figure 15B:
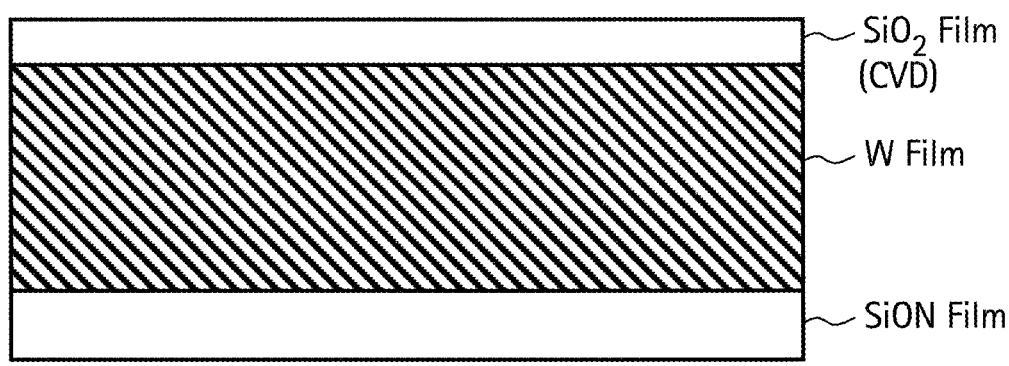

Further as to sample 4, the SiO$_2$ film is formed on a W film by CVD, by which an oxide layer may be formed; however, an oxide layer is not observed as shown in FIG. 15A.

Sample 3 and sample 4 in which oxide layers are formed are considered here. The silane gas employed by CVD, by which the SiO$_2$ film of sample 4 is formed contains hydrogen compared with the source gas used in a manufacturing process of the SiO$_2$ film in sample 3. Namely, an oxide layer is projected not to be formed in sample 4 due to the presence of hydrogen. Accordingly, a state in sample 4 can be thought to be varied due to the hydrogen although an oxide layer is formed on the W film.

As a result of the above, it is conceivable that an oxide layer which is different from a natural oxide film is formed when a protective film is formed on a metal film. Note that, it is regarded that the oxide layer is preferably about 3 nm thick when a W film is used. Further, it is preferable to form the protective film without containing hydrogen thereby forming the oxide film faultlessly.

In accordance with the above-mentioned result, it is considered necessary to form an oxide layer including the aforementioned metal (a metal oxide layer) on a metal layer for performing delamination. Particularly, when W is used for the metal film, it is found necessary to perform heat treatment at least at 400° C. thereby crystallize an oxide layer with a thickness of about 3 nm. Further according to the experimental result, it is found preferable to perform heat treatment at least at 430° C. since the crystallization of the oxide layer spreads all over.

Still further, it is found desirable that the aforementioned metal oxide layer on the metal layer is formed when the protective film is formed, and the protective film is formed in a state where hydrogen is not included or where the hydrogen concentration is low. When a W film is given as a concrete example, it is found preferable to form the protective film by sputtering using a source gas containing oxygen gas.

Embodiment 3

In this embodiment, a result of the observation of an oxide layer on the side of a substrate and the side of an amorphous semiconductor film after the separation using TEM will be shown.

Figure 19A:
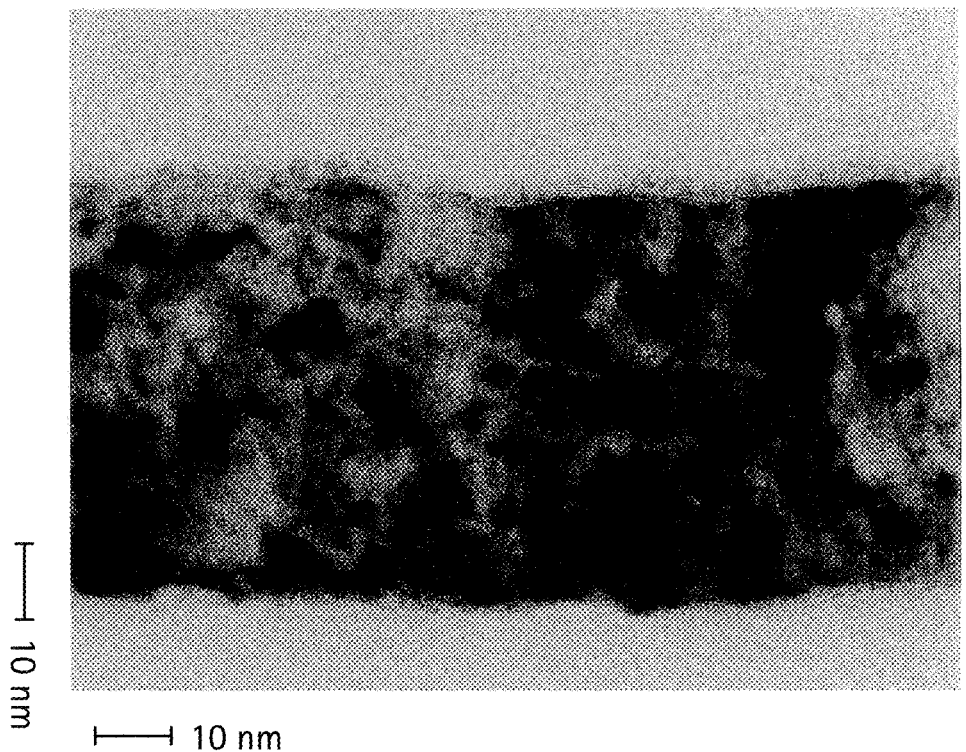
FIGS. 19A and 19B show a TEM picture and the frame format of the substrate side after the separation according to the present invention.
Figure 19B:
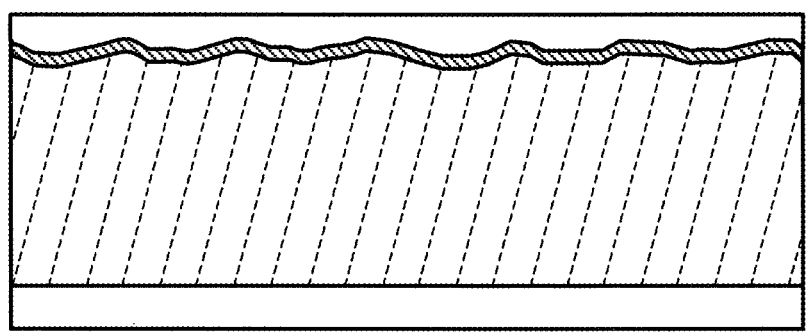
Figure 20A:
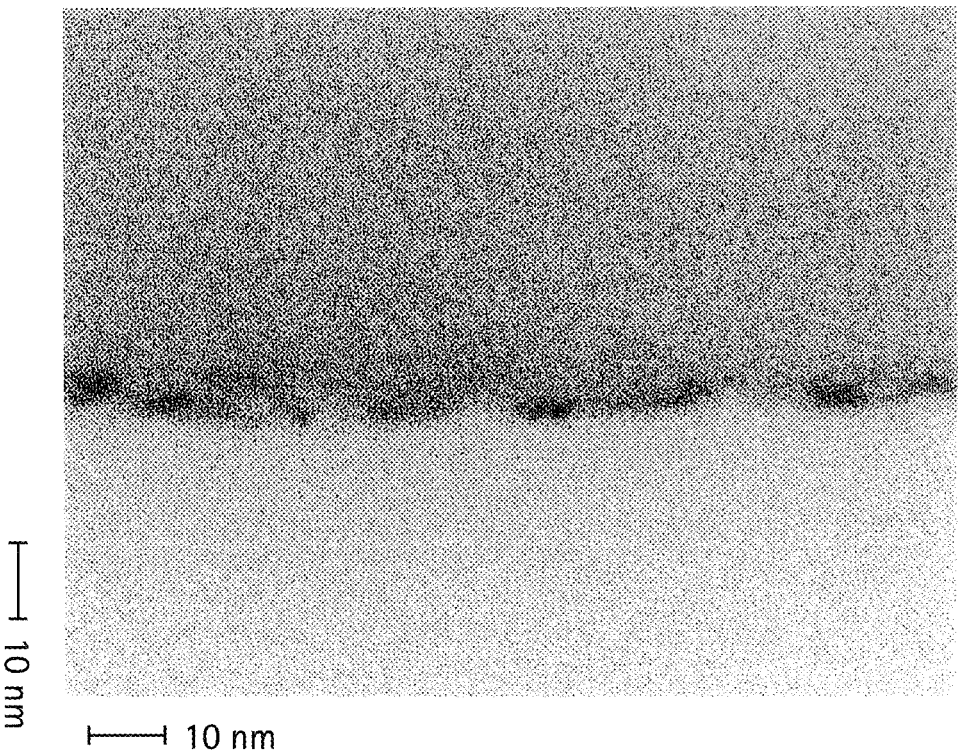
FIGS. 20A and 20B show a TEM picture and the frame format of the semiconductor film side after separation according to the present invention.
Figure 20B:
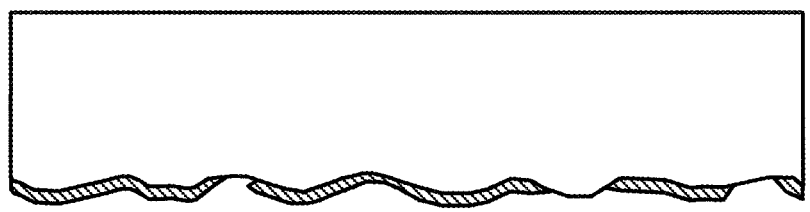

A W film with a thickness of 50 nm is formed over a glass substrate by sputtering; a silicon oxide film with a thickness of 200 nm is formed thereafter by sputtering; subsequently, an silicon oxynitride film with a thickness of 100 nm is formed as a base film by plasma CVD; and an amorphous film with a thickness of 50 nm is formed as a semiconductor film likewise by plasma CVD. Then, heat treatment is performed at 500° C. for 1 hour and at 550° C. for 4 hours; a quartz substrate is adhered by using epoxy resin as a bond; and separation is performed by a physical means. The TEM picture of the W film and the oxide layer on the substrate side at this point is shown in FIGS. 19A and 19B. The TEM picture of the oxide layer and the silicon oxynitride film on the semiconductor film is shown in FIGS. 20A and 20B.

In FIGS. 19A and 19B, the oxide layer remains nonuniformly on the metal film. Correspondingly, the oxide layer remains nonuniformly on the silicon oxide film, as shown in FIG. 20. The two pictures demonstrate that the separation occurs in a layer of the oxide layer or at the interfaces of the oxide layer, and that the oxide layer remains nonuniformly cohered to the metal film and the silicon oxide film.

Embodiment 4

The result of the examining the composition of the oxide layer by using XPS (X-ray photoelectron spectroscopy) is shown in this embodiment.

Figure 16A:
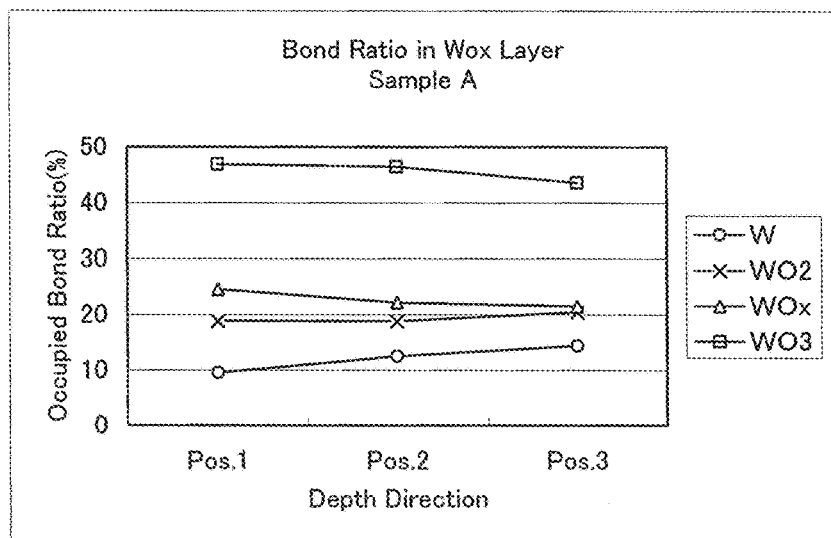
FIGS. 16A to 16C show XPS measurements of experimental samples A to C in the present invention.
Figure 16B:
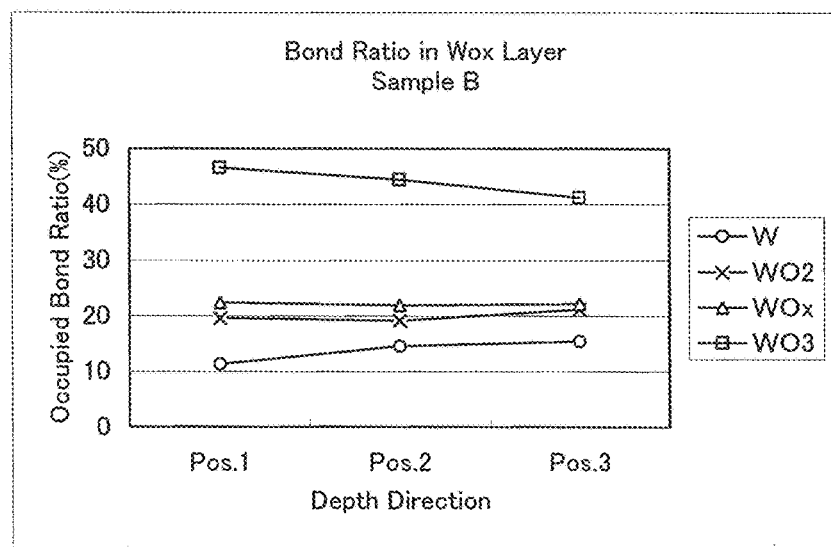
Figure 16C:
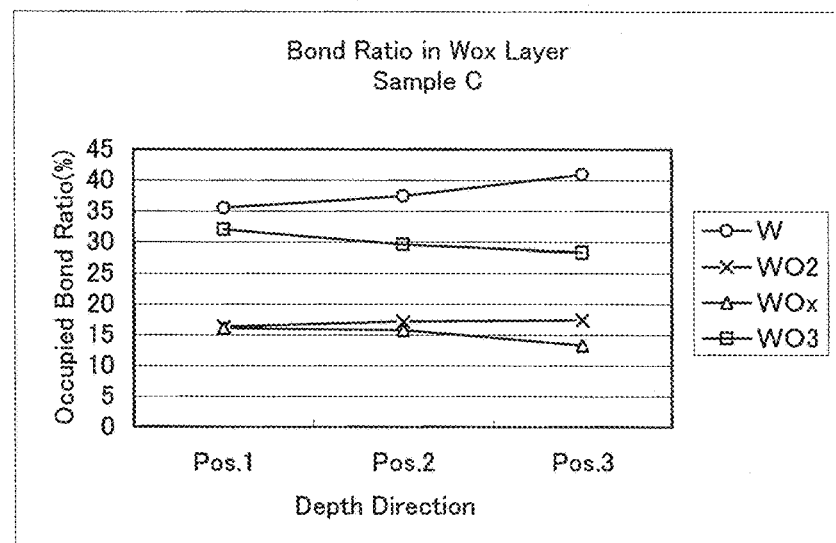

FIGS. 16A to 16C respectively show the results of samples A to C. In FIGS. 16A to 16C, the horizontal scale shows a depth direction (the interior of the oxide layer is exposed by ion sputtering. The case where 1 atomic % of tungsten is detected shall be pos. 1; the case where 2 atomic % of tungsten is detected shall be pos. 2; and the case where 3 atomic % of tungsten is detected shall be pos. 3)), the vertical scale shows an occupied bond ratio (%).

When FIGS. 16A to 16C are compared, the relative ratio of tungsten (W) that is shown with a circle is higher in sample C compared with samples A and B. Namely, sample C has a high proportion of tungsten and a low proportion of tungsten oxide.

Figure 17A:
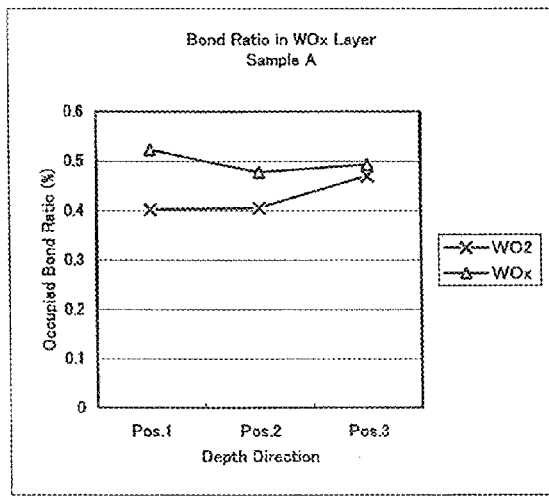
FIGS. 17A to 17F are figures in which XPS measurements shown in FIGS. 16A to 16C are standardized.
Figure 17B:
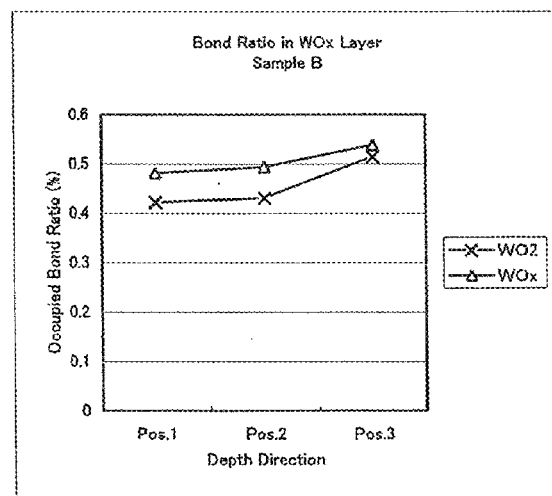
Figure 17C:
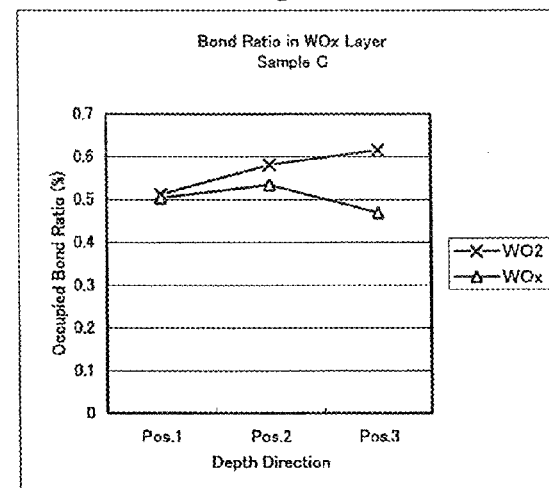
Figure 17D:
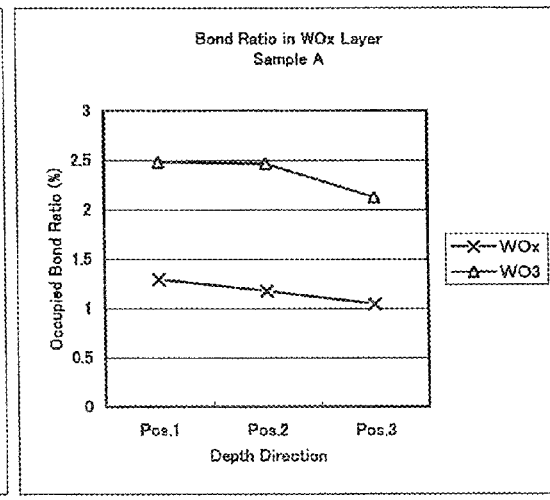
Figure 17E:
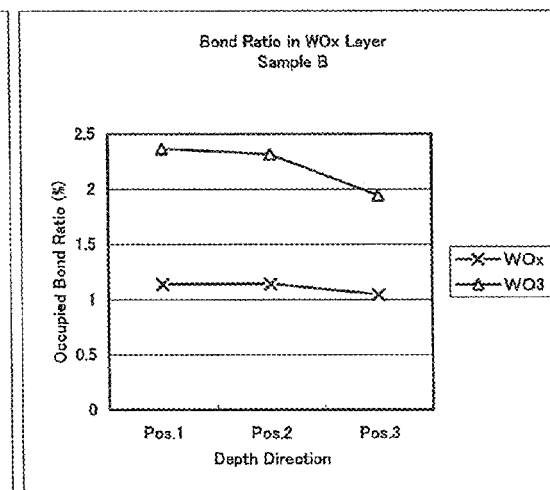
Figure 17F:
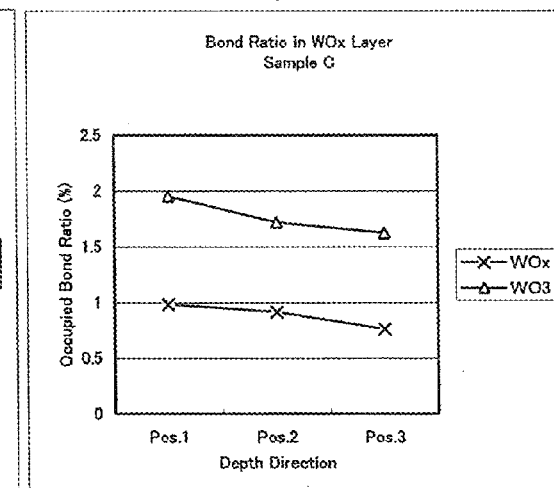

FIGS. 17A to 17F show the results of the standardization of the data of FIGS. 16A to 16C. FIGS. 17A and 17D correspond to the result of sample A. FIGS. 1733 and 17E correspond to the result of sample B. FIGS. 17C and 17F correspond to the result of sample C. FIGS. 17A to 17C show a graph in which $WO_3$ shall be 1 and the occupied bond ratio of the other compositions are standardized. FIGS. 17D to 17F show graphs in which $WO_2$ shall be 1 and the occupied bond ratio of the other compositions are standardized.

When FIGS. 17A to 17C are compared, the relative ratio of $WO_2$ that is shown with a cross is higher in sample C compared with samples A and B. Namely, sample C has a high proportion of $O_2$, and the proportion of $WO_2$ becomes higher as the depth increases from pos. 1 to pos. 3. Further, sample C has a low proportion of $WO_x$, and the proportion of $WO_2$ is found to become lower as the depth increases from pos. 1 to pos. 3. When FIGS. 17D to 17F are compared, samples A and B have $WO_2$ contents of at least 2% meanwhile sample C has a content of at most 2%. As apparent from the graph standardized on $WO_3$, sample C has higher proportion of $WO_2$ compared with samples A and B.

Figure 18A:
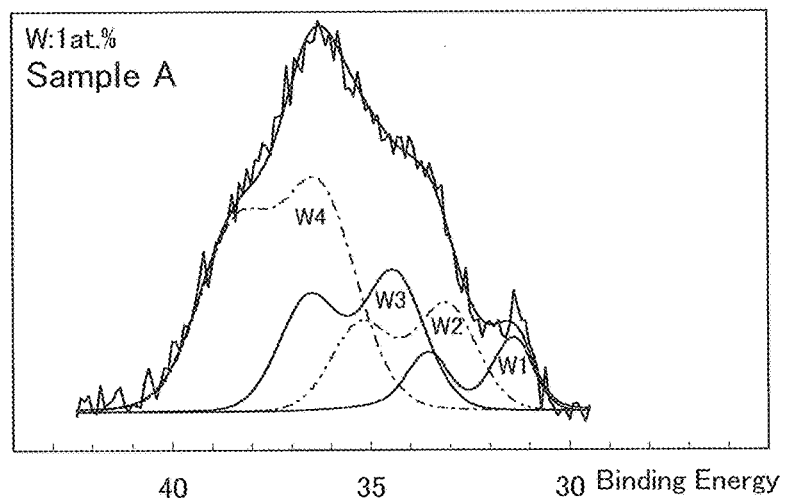
FIGS. 18A to 18C show XPS measurements of experimental samples A to C in the present invention.
Figure 18B:
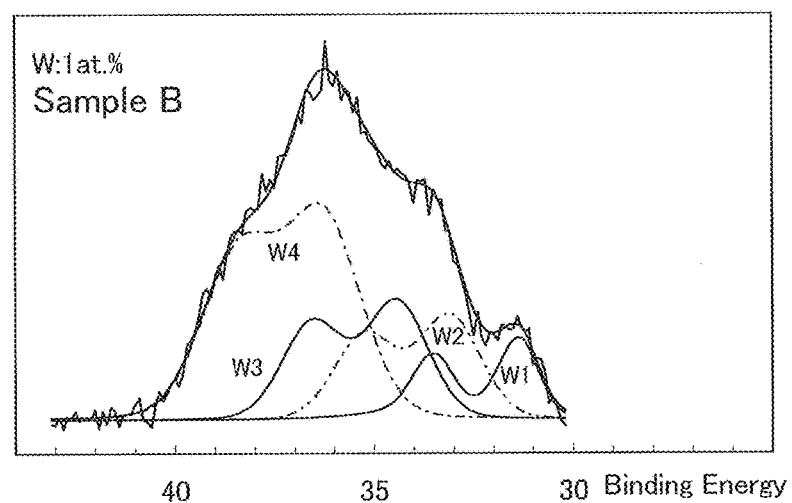
Figure 18C:
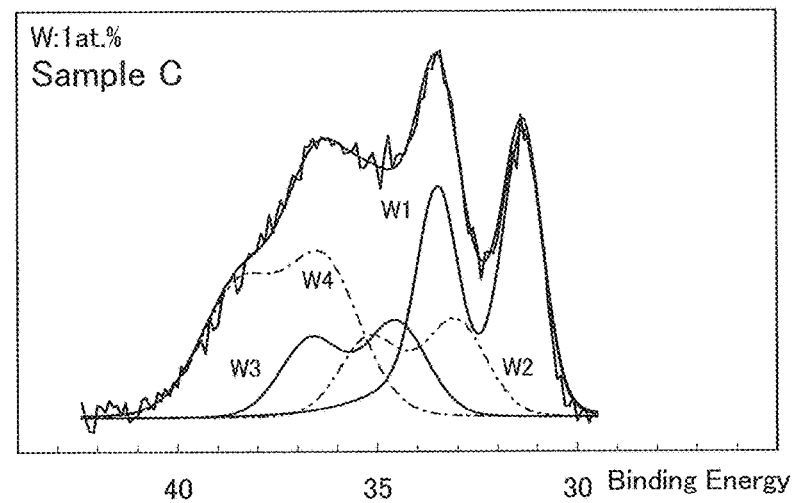

FIGS. 18A to 18C show waveform analysis of bond energy and spectrum observed when 1 atomic % of tungsten is detected (pos. 1), and the interior of the oxide layer is exposed by ion sputtering. FIG. 18A shows the result of sample A after sputtering process for four minutes and a quarter. FIG. 18B shows the result of sample B after sputtering process for four minutes. FIG. 18C shows the result of sample C after sputtering process for five minutes. In FIGS. 18A to 18C, as to each of 4 states: W1 (tungsten W), W2 (tungsten oxide $WO_x$, X is nearly 2), W3 (tungsten oxide $WO_x$, 2<X<3), and W4 (tungsten oxide $WO_3$ or the like), the area ratio (%) is equivalent to the composition ratio.

Chart 1 shows the area ratios of the respective states W1 to W4 of samples A to C obtained from FIGS. 18A to 18C. The Chart 1 further shows a graph in which W2 and W3 are standardized on W4 by ratio. In the Chart 1, samples A and B have 10% of the proportions of W1 while the proportion of sample C is high as 35%. Namely, sample C has a high proportion of tungsten and a low proportion of tungsten oxide. According to the standardized value, it is found that sample C has a high proportion of W2 ($WO_2$) in the tungsten oxide, compared with samples A and B.

Sample C has a high composition ratio of W2 ($WO_2$), and it is considered that the composition of the oxide layer is changed due to heat treatment. Accordingly, the composition of W4 ($WO_3$) is changed to W2 ($WO_2$) or W3 ($WO_x$) and it is conceivable that separation occurs between different crystal structures due to such differences of the crystal structures.

CHART 1

| Sample | Depth | W1 | W2 | W3 | W4 | W—Ox Standardized on WO3 in each State | | |
|---|---|---|---|---|---|---|---|---|
| | | | | | | W2 | W3 | W4 |
| A | Pos. 1 | 9.57 | 18.91 | 24.58 | 46.94 | 40.29% | 52.36% | 100.00% |
| | Pos. 2 | 12.54 | 18.83 | 22.19 | 46.44 | 40.55% | 47.78% | 100.00% |
| | Pos. 3 | 14.45 | 20.49 | 21.49 | 43.57 | 47.03% | 49.32% | 100.00% |
| B | Pos. 1 | 11.32 | 19.68 | 22.42 | 46.58 | 42.25% | 48.13% | 100.00% |
| | Pos. 2 | 14.57 | 19.15 | 21.91 | 44.38 | 43.15% | 49.37% | 100.00% |
| | Pos. 3 | 15.46 | 21.2 | 22.17 | 41.18 | 51.48% | 53.84% | 100.00% |
| C | Pos. 1 | 35.51 | 16.37 | 16.13 | 32 | 51.16% | 50.41% | 100.00% |
| | Pos. 2 | 37.44 | 17.2 | 15.8 | 29.57 | 58.17% | 53.43% | 100.00% |
| | Pos. 3 | 40.94 | 17.43 | 13.3 | 28.33 | 61.52% | 46.95% | 100.00% |

Figure 24A:
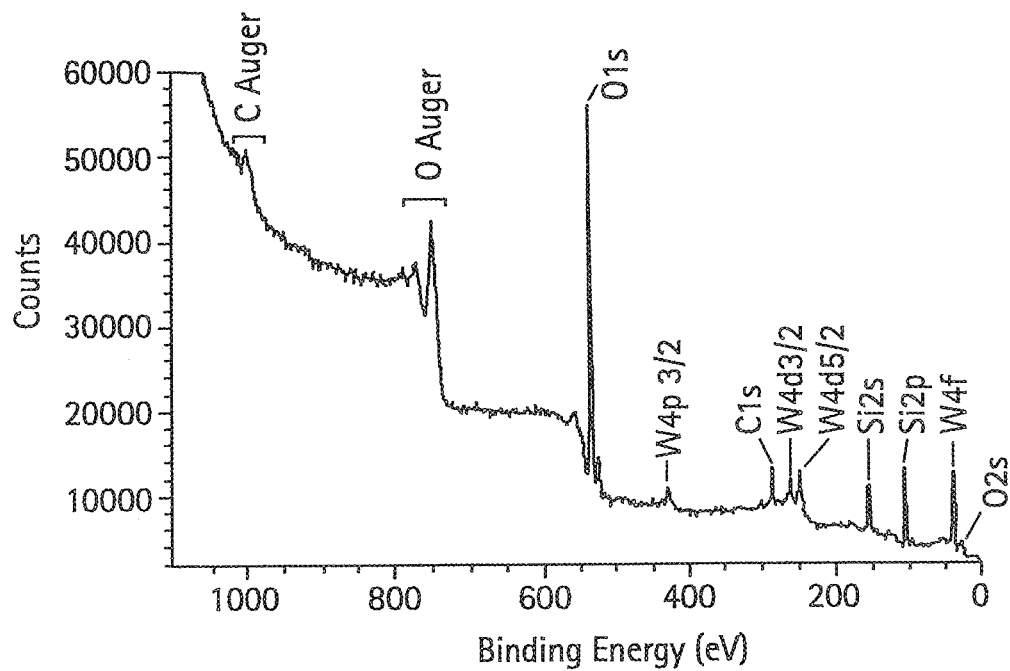
FIGS. 24A and 24B show XPS measurements after the separation according to the present invention.

Next, the side of the substrate after the separation and the side of the semiconductor film after the separation are measured with XPS. The measurements of the spectrum and the waveform analysis of the spectrum are shown in FIGS. 24A and 25B. Further, the XPS measurement of sample 1 and the waveform analysis thereof are shown together to compare the oxide layer with the natural oxide film.

Figure 24B:
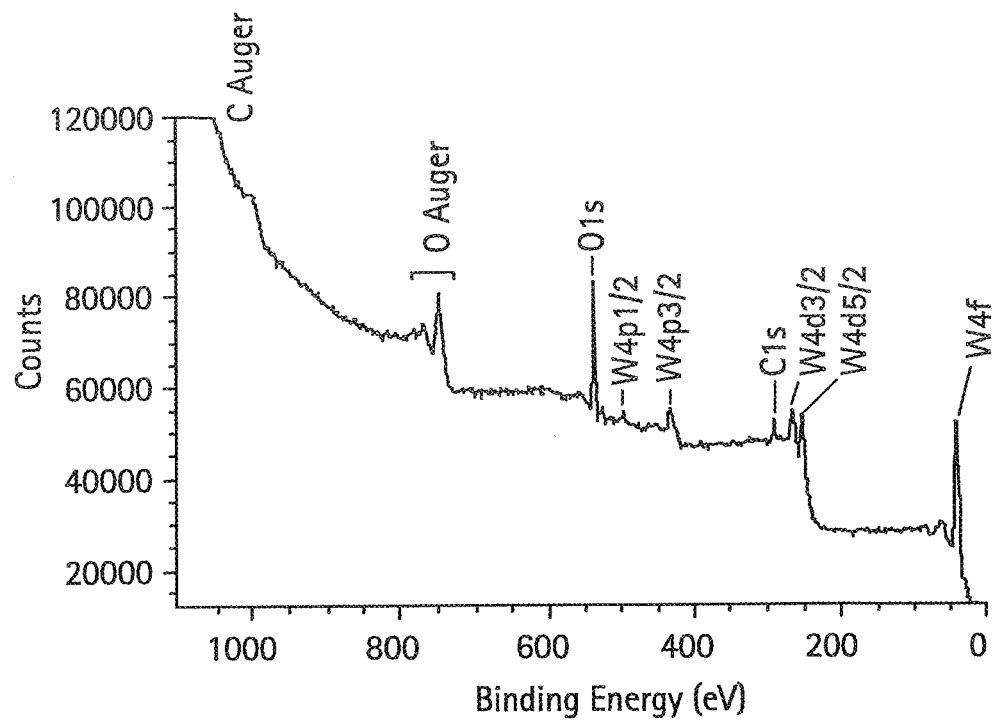

FIGS. 24A and 24B each show the spectrum of the separated surface which is measured with XPS. FIG. 24A shows the spectrum of the separated surface of the semiconductor film side. FIG. 24B shows the spectrum of the separated surface of the substrate side.

Chart 2 shows the detected elements and a quantitative result obtained from FIGS. 24A and 24B. The Chart 2 reveals that about ten times more tungsten remains on the side of the substrate than on the side of the semiconductor film.

CHART 2

|  | Oxygen (O) | Carbon (C) | Silicon (Si) | Tungsten (W) |
|---|---|---|---|---|
| Sample 1 | 41 | 20 | <1 | 38 |
| Semiconductor Film Side | 59 | 12 | 26 | 3 |
| Substrate Side | 51 | 20 | less than detection limit | 29 |

Figure 25A:
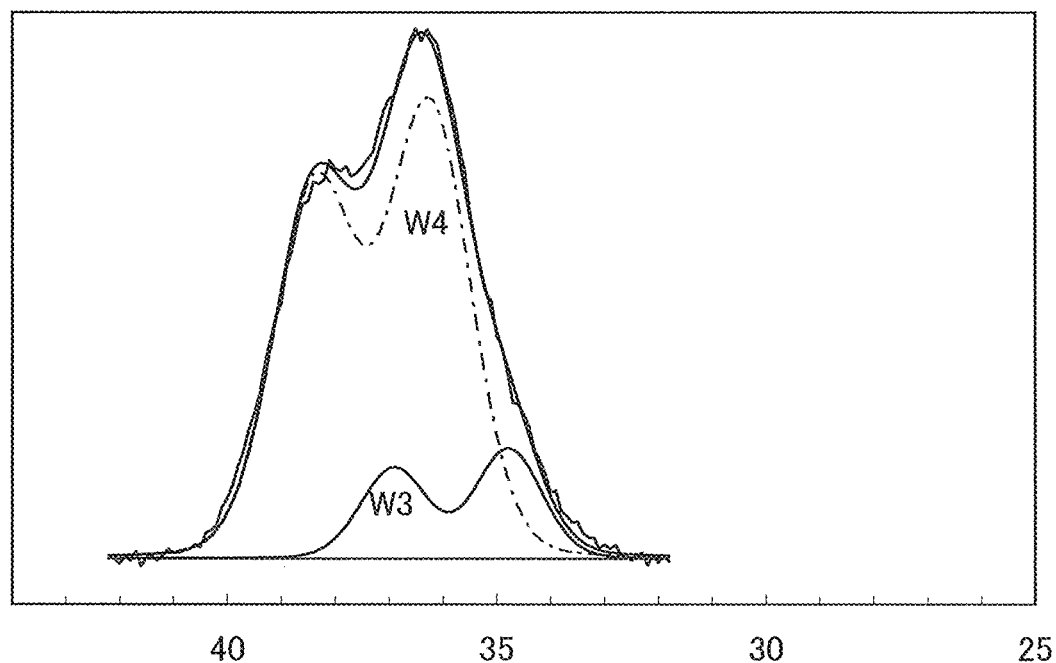
FIGS. 25A and 25B show waveform analysis of XPS measurements shown in FIGS. 24A and 24B.
Figure 25B:
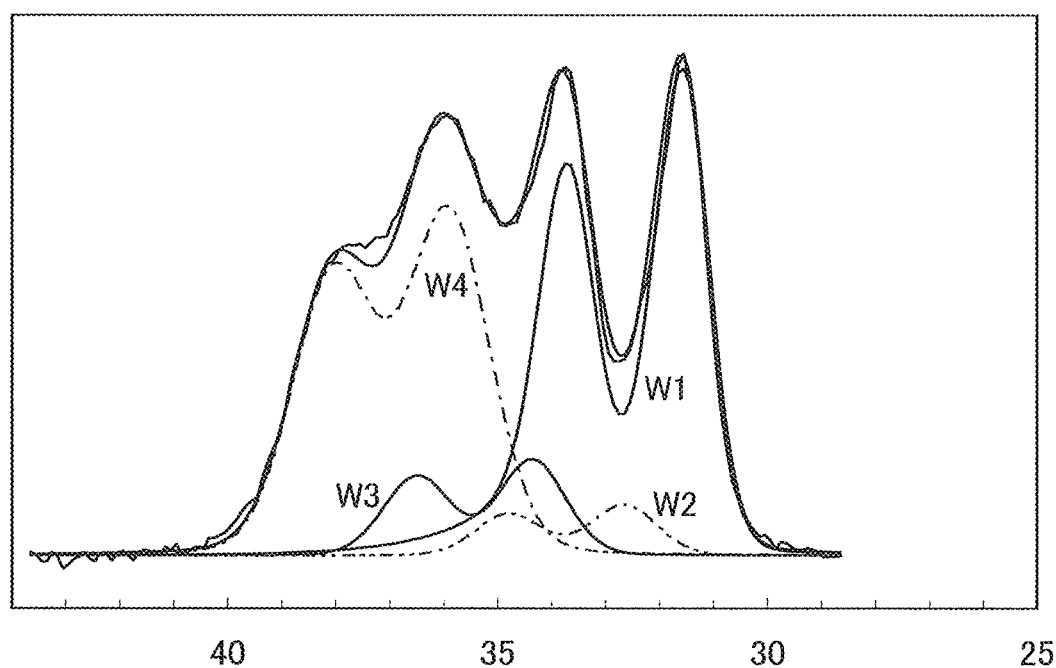

Subsequently, the waveform analysis of the spectrum on the side of the semiconductor film is shown in FIG. 25A. The waveform analysis of the spectrum on the side of the substrate is shown in FIG. 25B. In FIGS. 25A and 25B, as to each of 4 states: W1 (tungsten W), W2 (tungsten oxide $WO_x$, X is nearly 2), W3 (tungsten oxide $WO_x$, 2<X<3), and W4 (tungsten oxide $WO_3$ or the like), the area ratio (%) is equivalent to the composition ratio.

Figure 31:
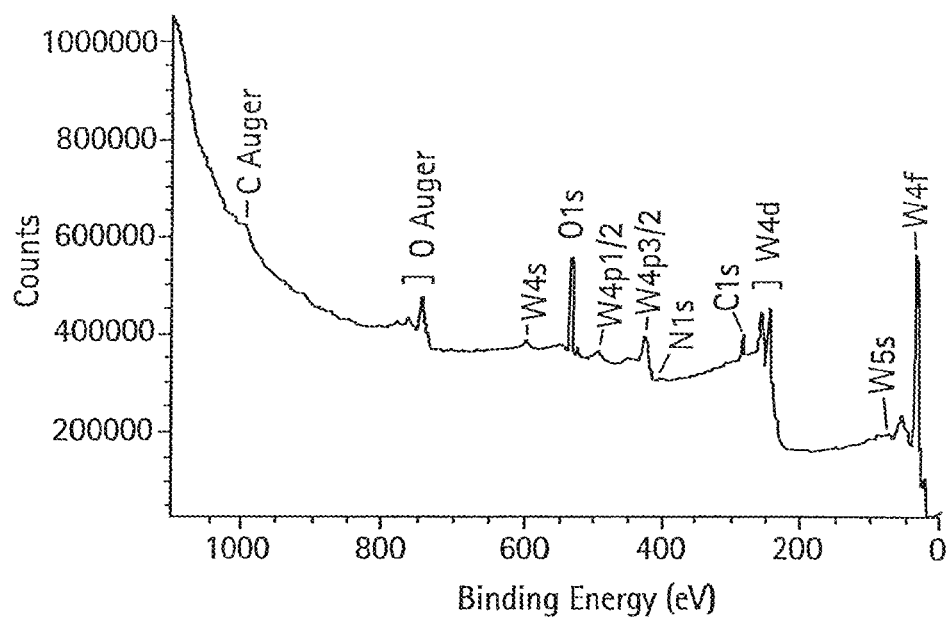
FIG. 31 shows an experimental result of the present invention.
Figure 32:
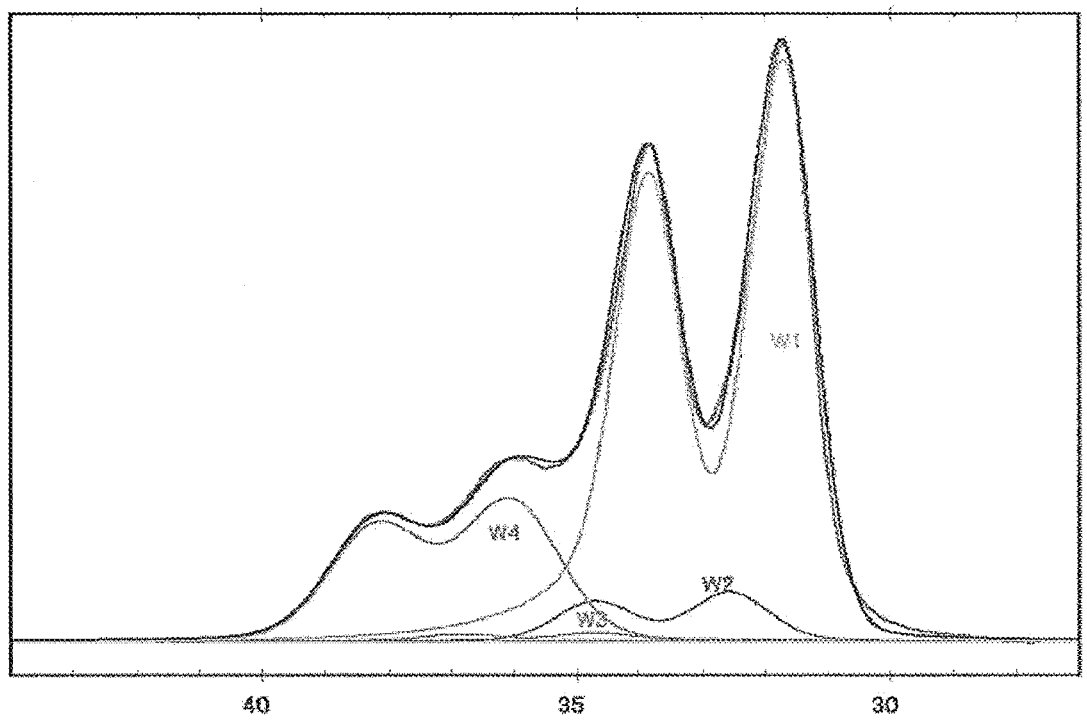
FIG. 32 shows an experimental result of the present invention.

The spectrum of sample 1 in which a natural oxide film is formed is shown in the XPS measurement in FIG. 31. The waveform analysis of the spectrum is shown in FIG. 32. The area ratio of each state in sample 1 and the intensity ratio of W2 and W3, which are standardized on W4 in each sample are shown in Chart 3. Further, the measurement of the surface of the semiconductor film side and the surface of the substrate side are shown together in the Chart 3.

CHART 3

| Sample | W1 | W2 | W3 | W4 | Intensity Standardized on W4 in each State | | |
|---|---|---|---|---|---|---|---|
| | | | | | W2 | W3 | W4 |
| Sample 1 | 69.54 | 6.42 | 1.03 | 23.01 | 27.90% | 4.48% | 100.00% |
| Semiconductor Film Side after Delamination | 0 | 0 | 16.48 | 83.52 | 0.00% | 19.73% | 100.00% |
| Substrate Side after Delamination | 43.52 | 5.04 | 9.53 | 41.91 | 12.03% | 22.74% | 100.00% |

Figure 30A:
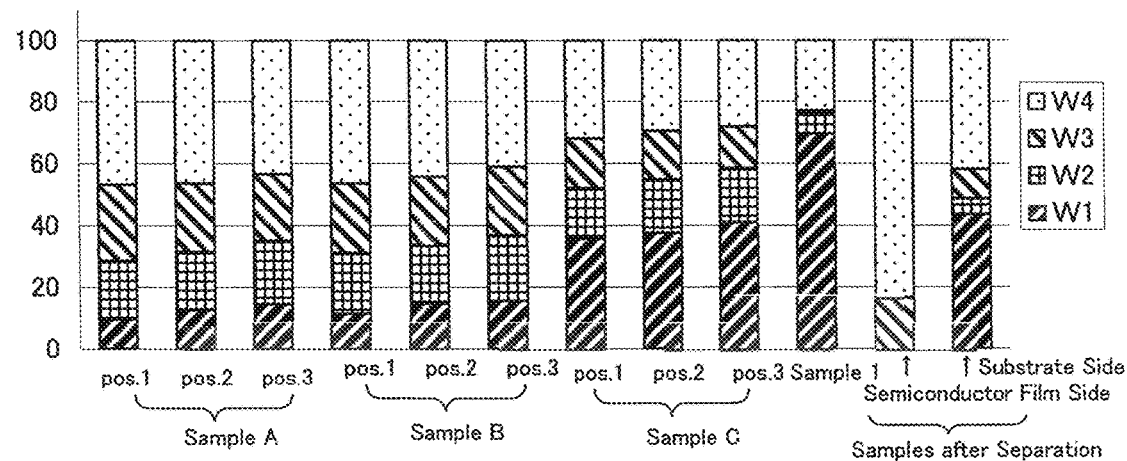
FIGS. 30A and 30B show experimental results of the present invention.
Figure 30B:
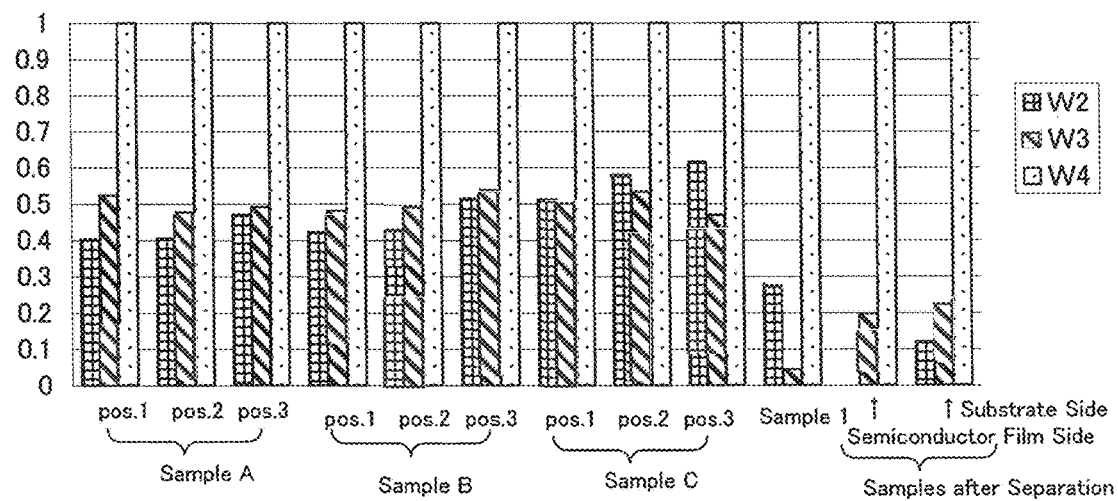

Further, FIG. 30A is a graph showing the intensity ratio of the components in W1 to W4 based upon the charts 1 and 3. FIG. 30B is a graph showing the intensity ratio of W2 and W3, which are standardized on W4.

The occupied bond ratio of the side of the semiconductor film after the separation are as follows: W1 and W2 are 0%, W3 is 16%, and W4 is 84%; meanwhile on the substrate side, W1 is 44%, W2 is 5%, W3 is 10%, and W4 is 46%. The occupied bond ratio of the natural oxide film in sample 1 is found to be as follows: W1 is 70; W2 is 6; W3 is 1; and W4 is 23.

In addition, the proportion of W1 (tungsten) is found to be higher in sample 1 compared with other samples. It is also found that the proportions of W2 to W4 (oxides) are low, and the proportion of W3 is considerably low.

The total amount of $WO_2$ on the sides of the semiconductor film and the substrate after the separation is found to be lower compared with $WO_2$ in sample C. Hence, it can be considered that the state of the oxide layer before separation is energetically active (unstable), and W4 ($WO_3$) as well as the natural oxide film become the main constituent thereby stabilizing the state after the separation.

When sample C which can be separated and sample 1 in which the natural oxide film is formed are compared using FIGS. 30A and 30B, sample C is found to contain more W2 to W4 (oxides).

Accordingly, when the separation is performed at the interface between the oxide layer and the metal film, at the interface between an oxide layer and the silicon oxide film, or in a layer of the oxide layer, it is found that all of W1 (metal W) and W2 ($WO_x$, X is nearly 2) remain on the substrate side; ⅔ of W4 ($WO_3$ and the like) remains on the semiconductor film side; and ⅓ thereof remains on the side of the substrate. Further, the composition ratios of the oxide layer and the natural oxide film are found to be different from each other. Thus, it is considered that the separation can easily be performed in a layer of the oxide layer, especially, at the interfaces between $WO_2$ and $WO_X$ or between $WO_2$ and $WO_3$. Therefore, $WO_2$ does not remain on the side of the semiconductor film and $WO_2$ adheres to the side of the substrate in the experiment; however, it can be possible that $WO_2$ adheres to the side of the semiconductor film and no $WO_2$ exists on the side of the substrate.

Embodiment 5

Figure 21:
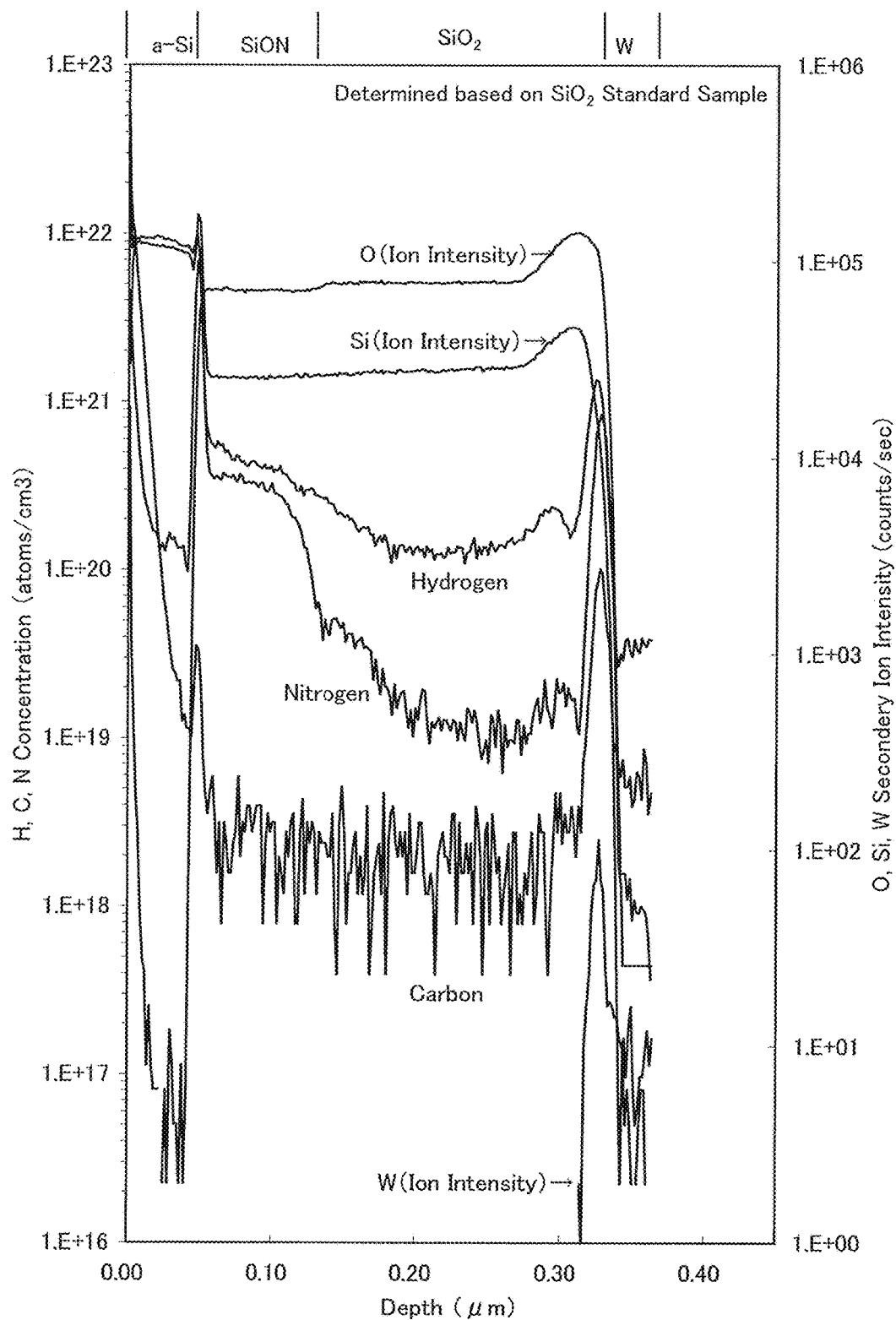
FIG. 21 shows SIMS of sample A in the present invention.
Figure 22:
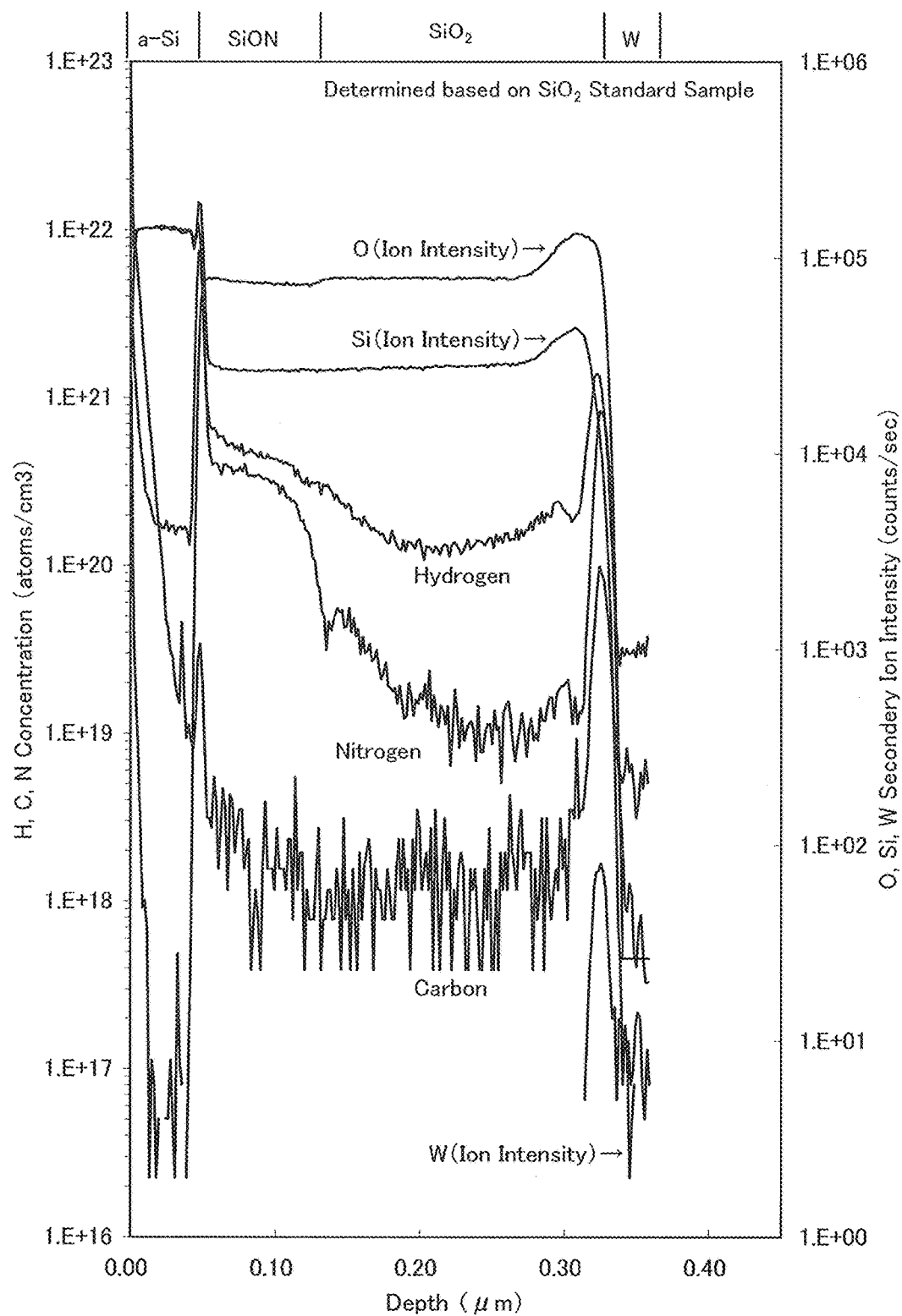
FIG. 22 shows SIMS of sample B in the present invention.
Figure 23:
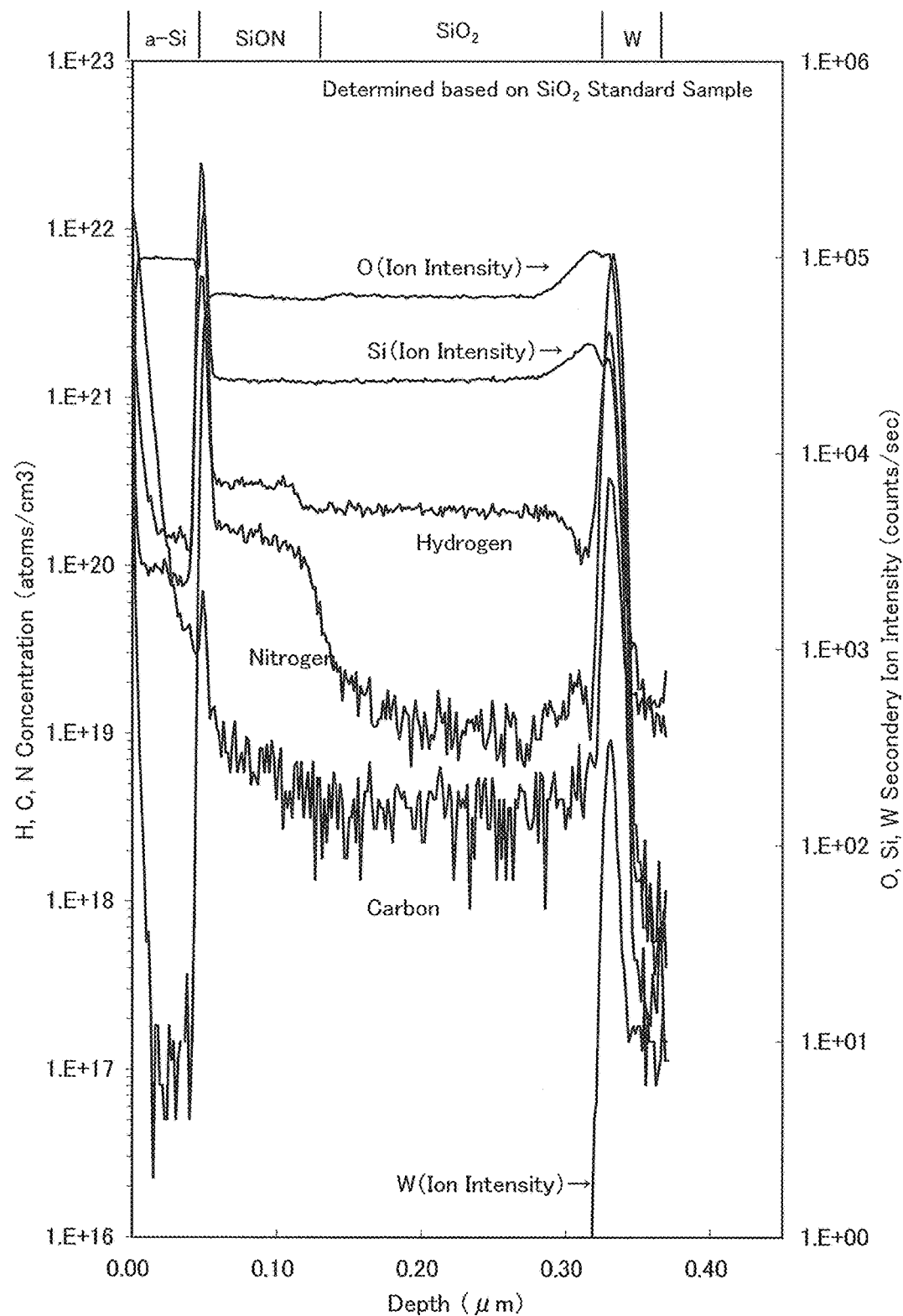
FIG. 23 shows SIMS of sample C in the present invention.

In this embodiment, the result of secondary ion composition analysis method (SIMS) performed against samples A to C will be described using FIGS. 21 to 23.

When the profile of hydrogen in an amorphous silicon film is noted, the hydrogen concentration is approximately $1.0 \times 10^{22}$ (atoms/cm$^3$) in sample A and B, whereas the hydrogen concentration is approximately $1.0 \times 10^{20}$ (atoms/cm$^3$) in sample C, almost twice as large as sample A and B. When the profiles of hydrogen in silicon oxynitride film (SiON) and a silicon oxide film ($SiO_2$) are observed, it shows the nonuniform concentration distribution, such as a tendency to decrease in the vicinity of a depth at 0.2 µm in sample A and B. On the other hand, sample C shows the uniform concentration distribution in the direction of depth without a tendency to decrease. Thus, more hydrogen exists in sample C than in samples A and B. According to the above result, it is considered that the ionization efficiency of hydrogen is different, and sample C has a composition ratio of surface different from samples A and B.

Next, when the nitrogen concentration at the interface between the silicon oxide film ($SiO_2$) and W film is noted, the nitrogen concentration is approximately $1.0 \times 10^{21}$ (atoms/cm$^3$) in sample A and B, whereas the nitrogen concentration is approximately $6.5 \times 10^{21}$ (atoms/cm$^3$) in sample C, which is about 1 order of magnitude more than the concentration in sample A and B. Accordingly, Sample C has a different composition of the oxide layer at the interface between the silicon oxide film ($SiO_2$) and the W film compared with samples A and B.

Embodiment 6

Figure 26A:
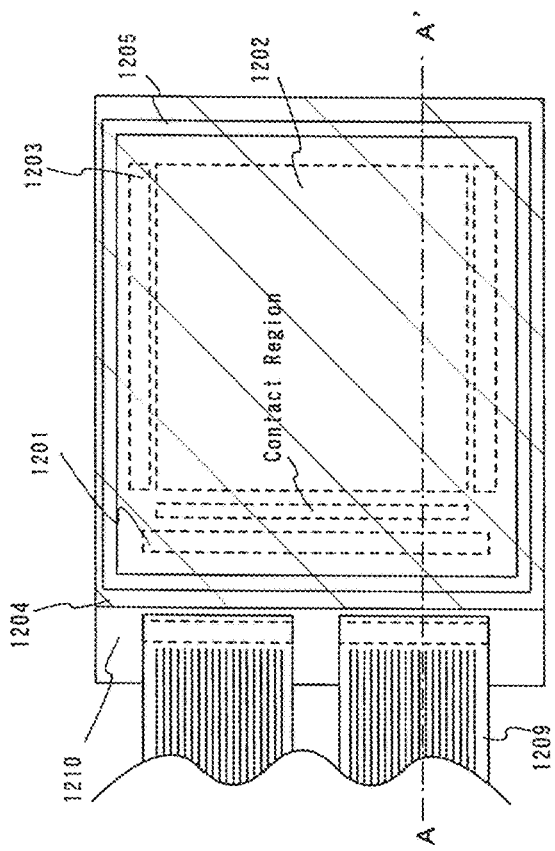
FIGS. 26A and 26B show a light emitting device formed according to the present invention.
Figure 26B:
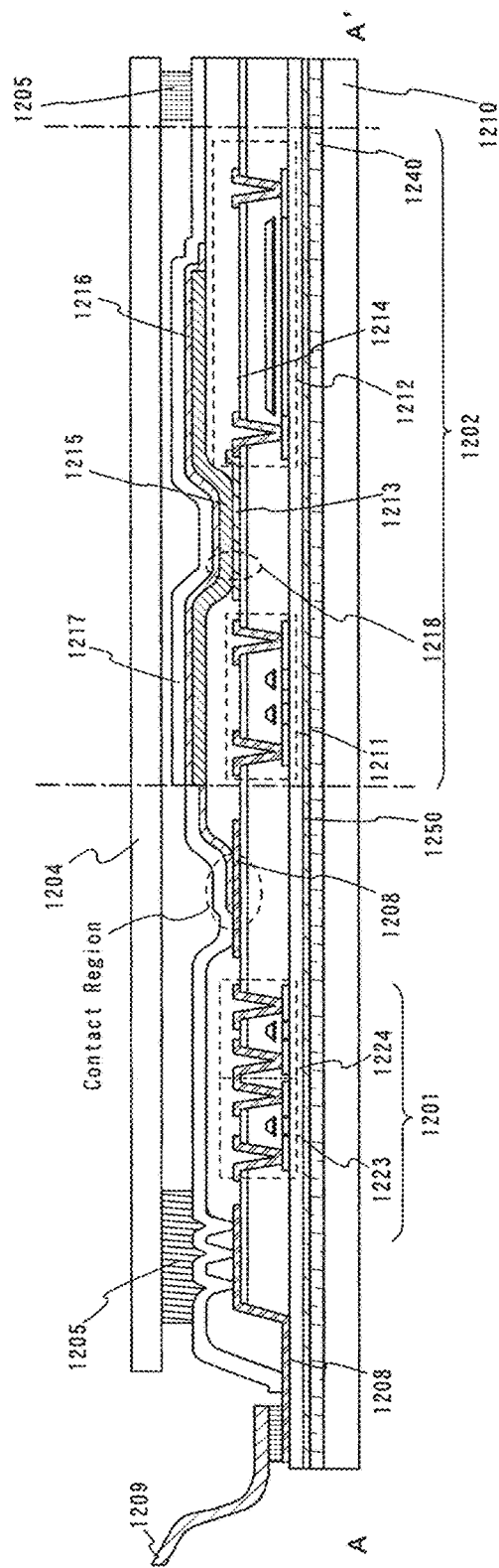

In this embodiment, a light emitting device which is provided with a TFT manufactured over a film substrate according to a delamination method of the present invention with reference to FIGS. 26A and 26B.

FIG. 26A shows a top view of a light emitting device; a signal line driver circuit 1201, a scanning line driver circuit 1203, and a pixel area 1202 are provided over a film substrate 1210.

FIG. 26B shows a cross section of a light emitting device taken along the line A-A', and an oxide layer 1250 is provided over the film substrate 1210 with a binding material 1240 therebetween. Note that, the oxide layer may be scattered instead of being formed as a layer on the back of the film substrate. When a W film is used as a metal film as described in the above embodiment, the oxide layer serves as an oxide comprising tungsten as a major component, $WO_3$, specifically.

A signal line driver circuit 1201 provided with a CMOS circuit comprising an n-channel TFT 1223 and a p-channel TFT 1224, which is formed over the film substrate is shown. A TFT forming a signal line driver circuit or the scanning line driver circuit may be formed from a CMOS circuit, a PMOS circuit, or an NMOS circuit. Further in this embodiment, a built-in driver type wherein a signal line driver circuit and a scanning line drive circuit are formed over a substrate is shown; however, the circuits may be formed outside the substrate instead.

Further, an insulating film 1214 comprising 1212 a switching TFT 1221 and a current controlling TFT, and further comprising an opening in a predetermined position, which covers the TFTs; a first electrode 1213 connected to one of wirings of the current controlling TFT 1212; an organic compound layer 1215 which is provided over a first electrode; a light emitting element 1218 comprising a second electrode 1216 which is provided opposite to the first electrode; and a pixel area 1220 comprising a protective layer 1217 which is provided to prevent deterioration of a light emitting element caused by water or oxygen, are shown.

Owing to the structure wherein the first electrode 1213 contacts a drain of the current controlling TFT 1212, it is desirable that at least the bottom of the first electrode 1213 shall be formed from a material that can form an ohmic contact with a drain region of the semiconductor film, or a material having a high work function in the surface comprising an organic compound. For example, when a three-layer structure of a titanium nitride film/a film comprising aluminum in major proportions/a titanium nitride film, is employed, the resistance as a wiring is low and the performance of making a good ohmic contact can be obtained. Further, the first electrode 1213 may be a single layer of a titanium nitride film, or a lamination having more than three layers. Furthermore, a light emitting device of a double side emission type can be manufactured by employing a transparent conductive film as the first electrode 1213.

The insulating film 1214 may be formed from an organic resin film or an insulating film comprising silicon. A positive photosensitive acrylic film is used here for the insulating film 1214.

It is preferable that the top edge and bottom edge of the insulating film 1214 is formed so as to have a curved surface with a curvature, thereby improving the coverage of a light emitting layer comprising an organic compound and the second electrode. For example, when a positive photosensitive acrylic film is employed for the insulating film 1214, it is preferable that the top edge of the insulating film 1214 solely has a curved surface with a curvature (0.2 µm to 3 µm). Further, whichever of a negative type that becomes insoluble in an etchant with light or a positive type that becomes soluble in an etchant with light can be used.

Further, the insulating film 1214 may be covered with a protective film. The protective film may be an aluminum nitride film obtained by a film formation system using sputtering (DC system or RF system) or remote plasma; an aluminum oxynitride film; an insulating film such as a silicon nitride film comprising silicon nitride or silicon oxynitride in major proportions; or a thin film comprising carbon in major proportions. It is desirable that the film thickness of the protective may be thin as possible so that light can transmit through the protective film.

A layer including an organic compound in which the luminescence of R, G, and B are obtained by applying an evaporation method with the use of a evaporation mask or ink-jetting is selectively formed over the first electrode 1213. Further the second electrode is formed over the layer including an organic compound 1215.

When the light emitting element 1218 shall emit white light, a color filter formed of a colored layer and a black mask needs to be formed.

The second electrode 1216 is connected to a connection wiring 1208 through an opening (a contact) provided over the insulating film 1214 in a connection area. The connection wiring 1208 is connected to a flexible printed circuit (FPC) 1209 by an anisotropic conductive resin (ACF). A video signal and a clock signal are received from an FPC 1209 which is to be an external input port. Only the FPC is illustrated here; however, a printed wiring board (PWB) may be attached to the FPC.

When the FPC is connected by applying pressure or heat with the use of an ACF, it is noted that a crack due to the flexibility of a substrate or softening caused by heat should be prevented from generating. For example, a substrate with high hardness may be disposed as an assistance on a part of the film substrate 1210, opposite to the part where the FPC is adhered.

The marginal portion of a substrate is provided with a sealing material 1205, and the substrate is pasted to a second film substrate 1204, and encapsulated. An epoxy resin is preferably used as the sealing material 1205.

In this embodiment, a substrate formed of FRP (Fiber-Reinforced Plastics), PVF (polyvinyl fluoride), mylar, polyester, acryl, or the like besides a glass substrate and a quartz substrate may be employed as a material for forming the second film substrate 1204.

Although it is not illustrated, the film substrate may be covered with a barrier film comprising an organic material such as polyvinyl alcohol or ethylene vinyl alcohol copolymer; an inorganic material such as polysilazane, aluminum oxide, silicon oxide, or silicon nitride; or a lamination of those, for preventing water or oxygen from penetrating through the film substrate.

A protective layer may be provided over the film substrate to protect from a medicine in a manufacturing process. An ultraviolet curable resin or a thermosetting resin can be used for the protective layer.

As described above, a light emitting device comprising a TFT provided over a film substrate is completed. The light emitting device comprising a TFT according to the present invention is hard to be broken even if it drops, and lightweight. A film substrate enables the enlargement of a light emitting device as well as mass production.

Embodiment 7

A liquid crystal display device comprising a formed over a film substrate by a delamination method according to the present invention will be described with reference to FIGS. 27A and 27B in this embodiment.

FIG. 27A shows a top view of a liquid crystal display device; a signal line driver circuit 1301, a scanning line driver circuit 1303, and a pixel area 1302 are provided over a first film substrate 1310.

FIG. 27B shows a cross section of a liquid crystal display device taken along the line A-A', and an oxide layer 1350 is formed over a film substrate 1310 with a binding material 1340 in between. Note that, the oxide layer may be scattered instead of being formed as a layer on the back of the film substrate. When a W film is used as a metal film as described in the above embodiment, the oxide layer serves as an oxide comprising tungsten as a major component, $WO_3$, specifically.

A signal line driver circuit 1301 provided with a CMOS circuit comprising an n-channel TFT 1323 and a p-channel TFT 1324 is formed over the film substrate. A TFT forming a signal line driver circuit or a scanning line driver circuit may be formed from a CMOS circuit, a PMOS circuit, or a NMOS circuit. Further in this embodiment, a built-in driver type wherein a signal line driver circuit and a scanning line drive circuit are formed over a substrate is shown; however, the circuits may be formed outside the substrate.

Further, a pixel area provided with an interlayer insulating film 1314 comprising a switching TFT 1321 and a retention volume 1312, and further comprising an opening in a predetermined position, which covers the TFTs is shown.

An oriented film 1317 is provided over the interlayer insulating film 1314, and is treated with rubbing.

A second film substrate 1304 is prepared as a counter substrate. The second film substrate 1304 is provided with a color filter of RGB 1330, a counter electrode 1316, and an oriented film 1317 that is treated with rubbing, in an area partitioned into matrix form with resin or the like.

A polarizer 1331 is provided over the first and second film substrates, and is adhered with a sealing material 1305. And a liquid crystal material 1318 is injected between the first and second film substrates. It is not illustrated; however, a spacer is provided appropriately to maintain a gap between the first and the second film substrates.

Although it is not illustrated, the film substrate may be covered with a barrier film comprising an organic material such as polyvinyl alcohol or ethylene vinyl alcohol copolymer; or an inorganic material such as polysilazane, or silicon oxide; or a lamination of those, for preventing water or oxygen from penetrating through the film substrate.

A protective layer may be provided to protect from a medicine in a manufacturing process. An ultraviolet curable resin or a thermosetting resin can be used for the protective layer.

Like in FIGS. 26A and 26B, a wiring and a flexible printed circuit (FPC) are connected together by an anisotropic conductive resin (ACF), and receive a video signal and a clock signal. Note that, a connection with an FPC by applying pressure or heat needs attention to prevent a crack from generating.

As described above, a liquid crystal display device comprising a TFT provided over a film substrate is completed. The liquid crystal display device comprising a TFT according to the present invention is hard to be broken even if it drops, and lightweight. A film substrate enables the enlargement of a liquid crystal display device as well as mass production.

Embodiment 8

An embodiment according to the present invention will be described with reference to FIG. 28. A panel having a pixel area, a driver circuit for controlling the pixel area, a memory circuit, and a CPU comprising a control unit and an arithmetic unit over on insulating surface will be explained in this embodiment.

Figure 28:
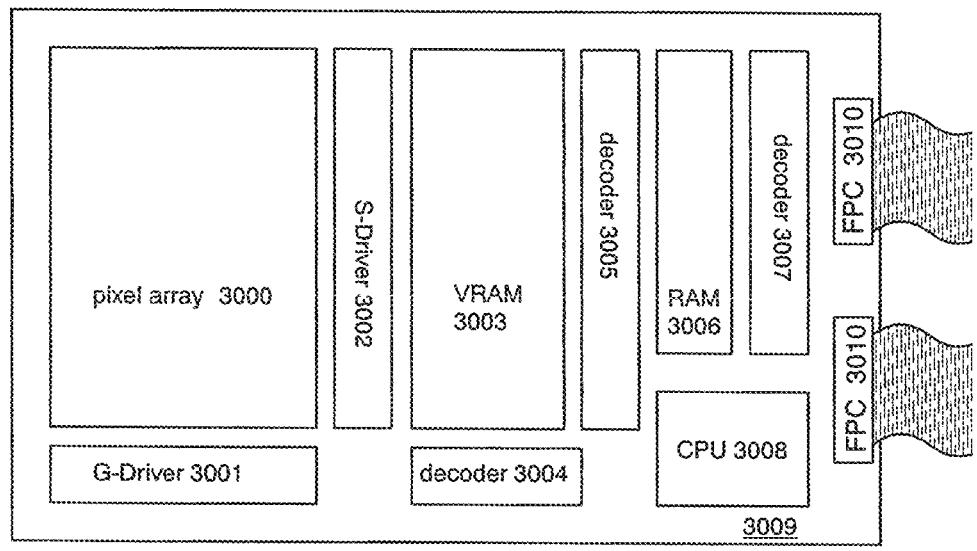
FIG. 28 shows a CPU formed according to the present invention.

FIG. 28 shows the appearance of a panel. The panel has a pixel area 3000 wherein plural pixels are arranged in matrix over a substrate 3009. A scanning line driver circuit 3001, a scanning line driver circuit 3001 for controlling the pixel area 3000, and a signal line driver circuit 3002 are provided at the periphery of the pixel area 3000. In the pixel area 3000, an image is displayed according to a signal supplied from the driver circuit.

The counter substrate may be provided only over the pixel area 3000 and the driver circuits 3001 and 3002, or may be provided over the entire surface alternatively. Note that, it is preferable that the CPU 3008 that may generate heat be provided with a heat sink contiguously.

Further, the panel also has a VRAM 3003 (video random access memory) for controlling the driver circuits 3001 and 3002, and decoders 3004 and 3005 at the periphery of the VRAM 3000. In addition, the panel has a RAM (random access memory) 3006, a decoder 3007 at the periphery of the RAM 3006, and the CPU 3008.

All elements forming a circuit over the substrate 3009 are formed of a polycrystalline semiconductor (polysilicon) that has higher field-effect mobility and higher ON current than that of an amorphous semiconductor. Therefore, a plurality of circuits can be formed into an integrated circuit over one insulating surface. A pixel area 3001, driver circuits 3001 and 3002, and another circuit are formed over a support substrate first, and separated by the delamination method according to the present invention, then, pasted with each other thereby achieving an integrated structure over there flexible substrate 3009. The structure of the plural pixels in the pixel area is, but not exclusively, formed by providing SRAM to each of the plural pixels. Thus, VRAM 3003 and RAM 3006 may be omitted.

Embodiment 9

The present invention can be applied to various electronic devices. Given as examples as the electronic devices: a personal digital assistance (a cellular phone, a mobile computer, a portable game machine, an electronic book, or the like), a video camera, a digital camera, a goggle type display, a display, a navigation system, and the like. FIGS. 29A to 29E are views showing these electronic devices.

Figure 29A:
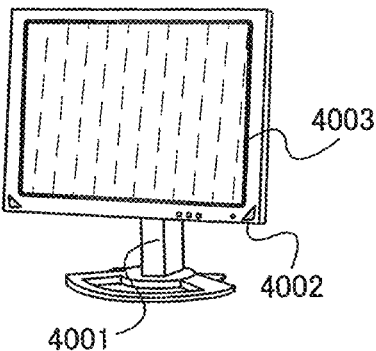
FIGS. 29A to 29E show electronic devices formed according to the present invention.

FIG. 29A shows a display including a frame 4001, a sound output unit 4002, a display unit 4003, and the like. The present invention is used to the display unit 4003. The display includes all information displays such as a personal computer, a TV broadcasting, and an advertisement display.

Figure 29B:
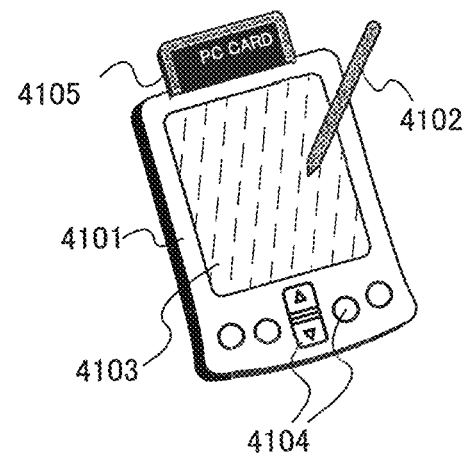

FIG. 29B shows a mobile computer having a main body 4101, a stylus 4102, a display unit 4103, an operation button 4104, an external interface 4105, and the like. The present invention is used to the display unit 4103.

Figure 29C:
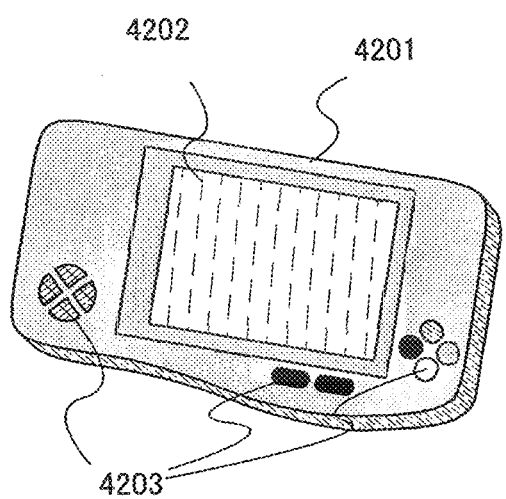

FIG. 29C shows a game machine including a main body 4201, a display unit 4202, an operation button 4203, and the like. The present invention is used to the display unit 4202.

Figure 29D:
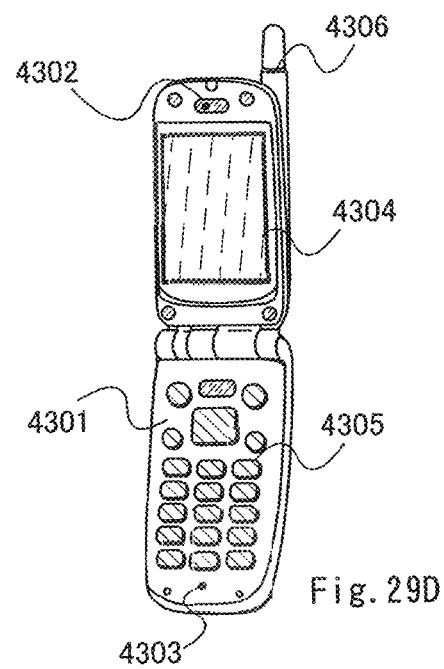

FIG. 29D is a cellular phone including a main body 4301, a sound output unit 4302, a sound input unit 4303, a display unit 4304, an operation switch 4305, an antenna 4306, and the like. The present invention is used to the display unit 4304.

Figure 29E:
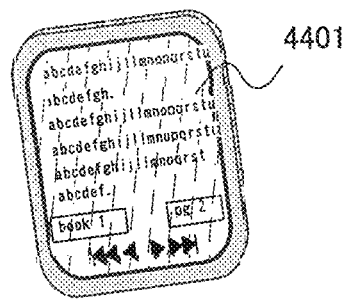

FIG. 29E shows a electronic book reader including a display unit 4401 and the like. The present invention is used to the display unit 4401.

Since the application range of the present invention is extremely large, the present invention can be applied to various electronic devices in all fields. Especially, the present invention that enables devices to be thinner and/or lighter is remarkably effective for the electronic devices illustrated in FIGS. 29A to 29E.

By employing a delamination method according to the present invention, a TFT or the like can be formed over a flexible film substrate achieving high yield since separation can be performed in the whole surface. Further, a burden caused by a laser or the like are not placed on a TFT in the present invention. Thus, a light emitting device, a display unit of a liquid crystal display device, or the like, which has the nil and the like can be made thin, hard to be broken even if it drops, and lightweight. Further, display on a curved surface or in odd-shape is enabled.

A TFT on a film substrate, which is formed according the present invention can achieve the enlargement of display units as well as mass production. The present invention enables the recycling of a first substrate on which a TFT or the like to be formed before transferring, and achieves reducing costs of a semiconductor film by employing a low-cost film substrate.

What is claimed is:

1. A light emitting device comprising:
   a plastic substrate;
   a barrier film over the plastic substrate;
   an insulating film over the barrier film;
   a transistor over the insulating film; and
   a light emitting element which is over and electrically connected to the transistor,
   wherein a top surface of the barrier film and a bottom surface of the insulating film are adhered to each other with an adhesive material,
   wherein a metal oxide remains nonuniformly at the bottom surface of the insulating film, and
   wherein the metal oxide is in contact with the adhesive material.

2. The light emitting device according to claim 1, wherein the barrier film comprises at least one of silicon nitride, silicon oxide, and aluminum oxide.

3. The light emitting device according to claim 1, wherein the barrier film comprises a lamination of silicon nitride and silicon oxide.

4. The light emitting device according to claim 1, wherein the metal oxide has crystallinity.

5. The light emitting device according to claim 1, wherein the light emitting device includes a curved surface.

6. The light emitting device according to claim 1, wherein the metal oxide comprises tungsten.

7. The light emitting device according to claim 1, wherein the metal oxide comprises at least one material selected from Ti, Ta, Mo, Nd, Ni, Co, Zr, Zn, Ru, Rh, Pd, Os, and Ir.

8. A light emitting device comprising:
   a plastic substrate;
   an insulating film over the plastic substrate;
   a transistor over the insulating film; and
   a light emitting element which is over and electrically connected to the transistor,
   wherein a top surface of the plastic substrate and a bottom surface of the insulating film are adhered to each other with an adhesive material,
   wherein a metal oxide remains nonuniformly at the bottom surface of the insulating film, and
   wherein the metal oxide is in contact with the adhesive material.

9. The light emitting device according to claim 8, wherein the metal oxide has crystallinity.

10. The light emitting device according to claim 8, wherein the light emitting device includes a curved surface.

11. The light emitting device according to claim 8, wherein the metal oxide comprises tungsten.

12. The light emitting device according to claim 8, wherein the metal oxide comprises at least one material selected from Ti, Ta, Mo, Nd, Ni, Co, Zr, Zn, Ru, Rh, Pd, Os, and Ir.

* * * * *